(12) United States Patent
Shimazawa

(10) Patent No.: US 7,394,302 B2
(45) Date of Patent: Jul. 1, 2008

(54) SEMICONDUCTOR CIRCUIT, OPERATING METHOD FOR THE SAME, AND DELAY TIME CONTROL SYSTEM CIRCUIT

(75) Inventor: Takayoshi Shimazawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/105,486

(22) Filed: Apr. 14, 2005

(65) Prior Publication Data

US 2006/0132212 A1   Jun. 22, 2006

(30) Foreign Application Priority Data

Dec. 17, 2004   (JP) ............................. 2004-365568

(51) Int. Cl.
*H03H 11/26* (2006.01)
(52) U.S. Cl. ..................... 327/277; 327/276; 327/261
(58) Field of Classification Search ................ 327/231, 327/270, 277, 276, 310, 10, 261, 276.3
See application file for complete search history.

(56) References Cited

U.S. PATENT DOCUMENTS

| 6,404,262 | B1 * | 6/2002 | Nagaraj et al. ............... 327/336 |
| 6,470,484 | B1 * | 10/2002 | Day et al. ........................ 716/8 |
| 6,510,542 | B1 * | 1/2003 | Kojima ......................... 716/10 |
| 6,598,212 | B2 * | 7/2003 | Okayasu ......................... 716/4 |
| 6,654,214 | B1 * | 11/2003 | Karanicolas .................. 361/56 |
| 6,754,877 | B1 * | 6/2004 | Srinivasan ...................... 716/2 |
| 6,785,875 | B2 * | 8/2004 | Beerel et al. .................... 716/6 |
| 2004/0243957 | A1 * | 12/2004 | Mandry ......................... 716/6 |
| 2005/0093604 | A1 * | 5/2005 | Kang et al. ................. 327/276 |

FOREIGN PATENT DOCUMENTS

| JP | 2001-111391 | 4/2001 |
| JP | 2001-230324 | 8/2001 |

* cited by examiner

*Primary Examiner*—Dinh T. Le
(74) *Attorney, Agent, or Firm*—Oblon, Spivak, McClelland, Maier & Neustadt, P.C.

(57) ABSTRACT

A semiconductor circuit allows a timing adjustment after detailed routing without rearrangement and rerouting, an adjustment of delay variance due to process variation, and a delay adjustment even after chip formation using a primitive cell with a built-in means for adjusting delay time. The circuit connected between an input pad and an output pad, an operating method for the same, and a delay time control system circuit, which externally adjusts delay time of a plurality of control terminal-equipped/variable capacitance embedded buffers configures a semiconductor circuit. The structure includes: a first buffer connected between the input pad and the output pad; and a plurality of capacitances connectable in parallel between a fixed potential and a current flowing path, which is positioned between the first buffer and the output pad, and that controls connection between each of the plurality of capacitances and the output pad.

11 Claims, 19 Drawing Sheets

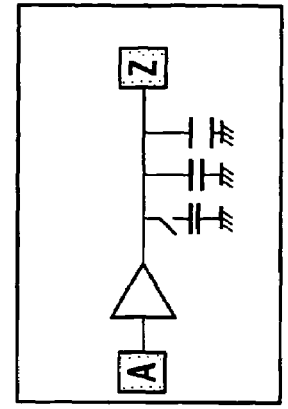
FIG. 3D
CNIVX8D3
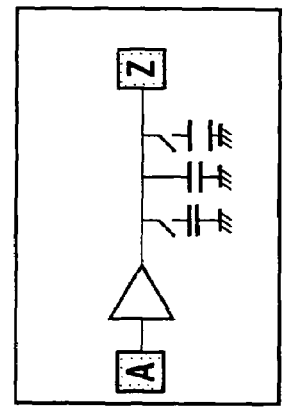
FIG. 3C
CNIVX8D2
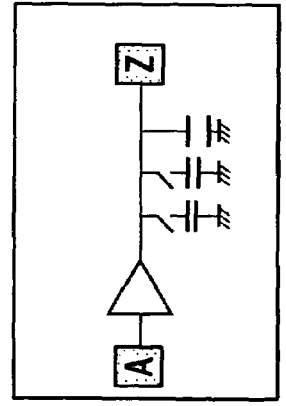
FIG. 3B
CNIVX8D1
FIG. 3A
CNIVX8D0
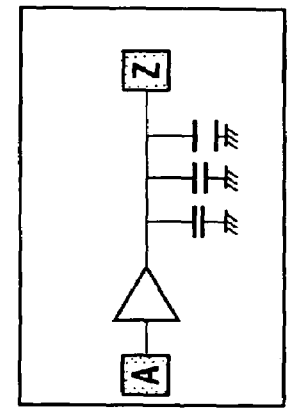
FIG. 3H
CNIVX8D7
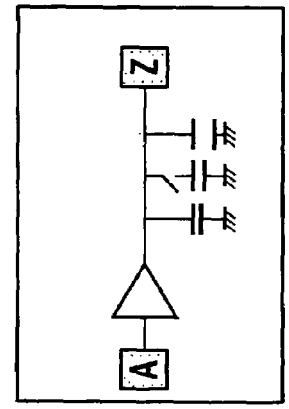
FIG. 3G
CNIVX8D6
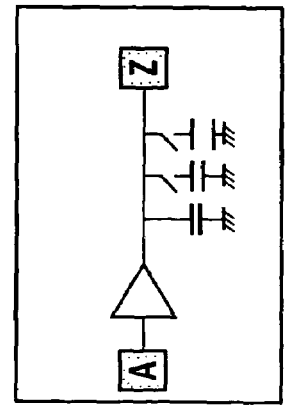
FIG. 3F
CNIVX8D5
FIG. 3E
CNIVX8D4

FIG. 4

```
CNIVX8D4      iData63    (.Z(Data[63]),    .A(net63));
CNIVX8D4      iData62    (.Z(Data[62]),    .A(net62));
CNIVX8D4      iData61    (.Z(Data[61]),    .A(net61));
. . .
CNIVX8D4      iData1     (.Z(Data[1]),     .A(net1));
CNIVX8D4      iData0     (.Z(Data[0]),     .A(net0));
```

FIG. 5

```
CNIVX8D1      iData63    (.Z(Data[63]),    .A(net63));
CNIVX8D2      iData62    (.Z(Data[62]),    .A(net62));
CNIVX8D4      iData61    (.Z(Data[61]),    .A(net61));
. . .
CNIVX8D6      iData1     (.Z(Data[1]),     .A(net1));
CNIVX8D7      iData0     (.Z(Data[0]),     .A(net0));
```

FIG. 10A
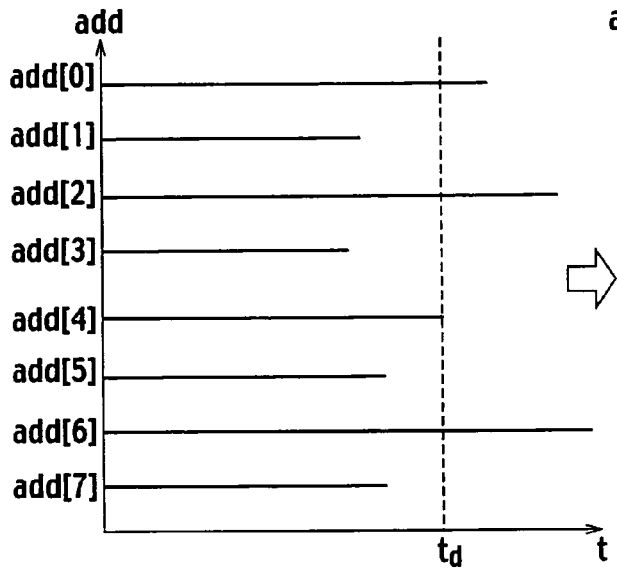
FIG. 10B
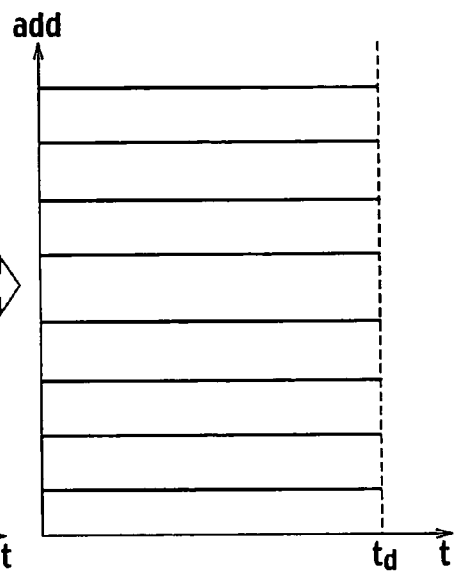
FIG. 10C
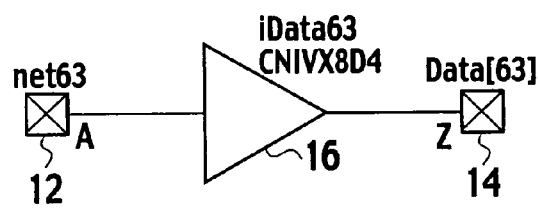
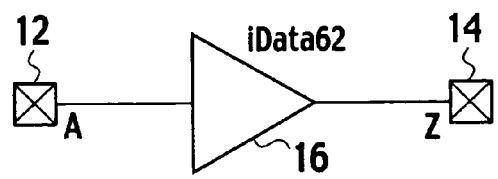

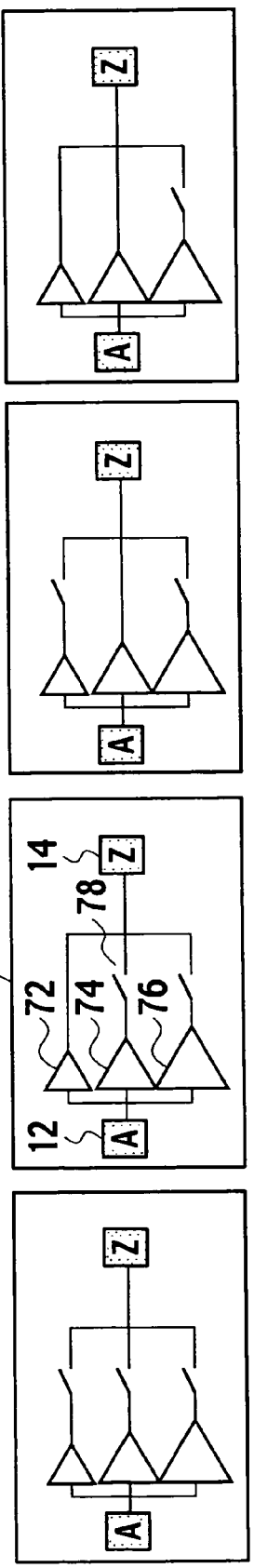
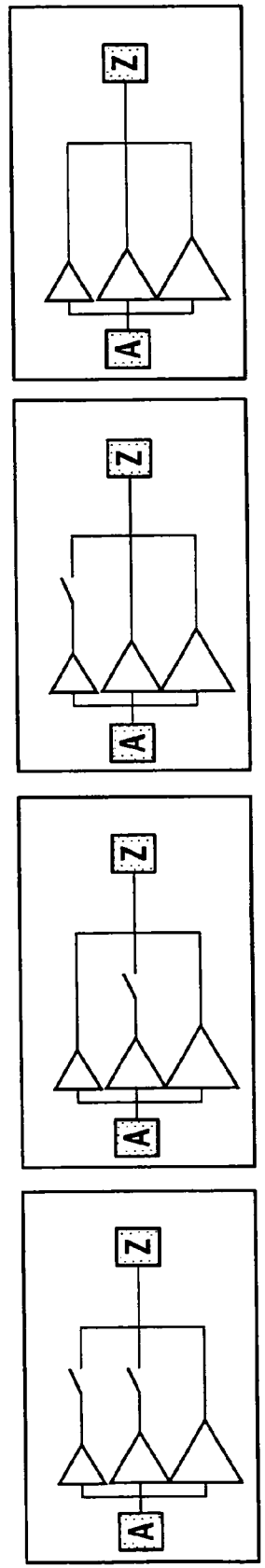

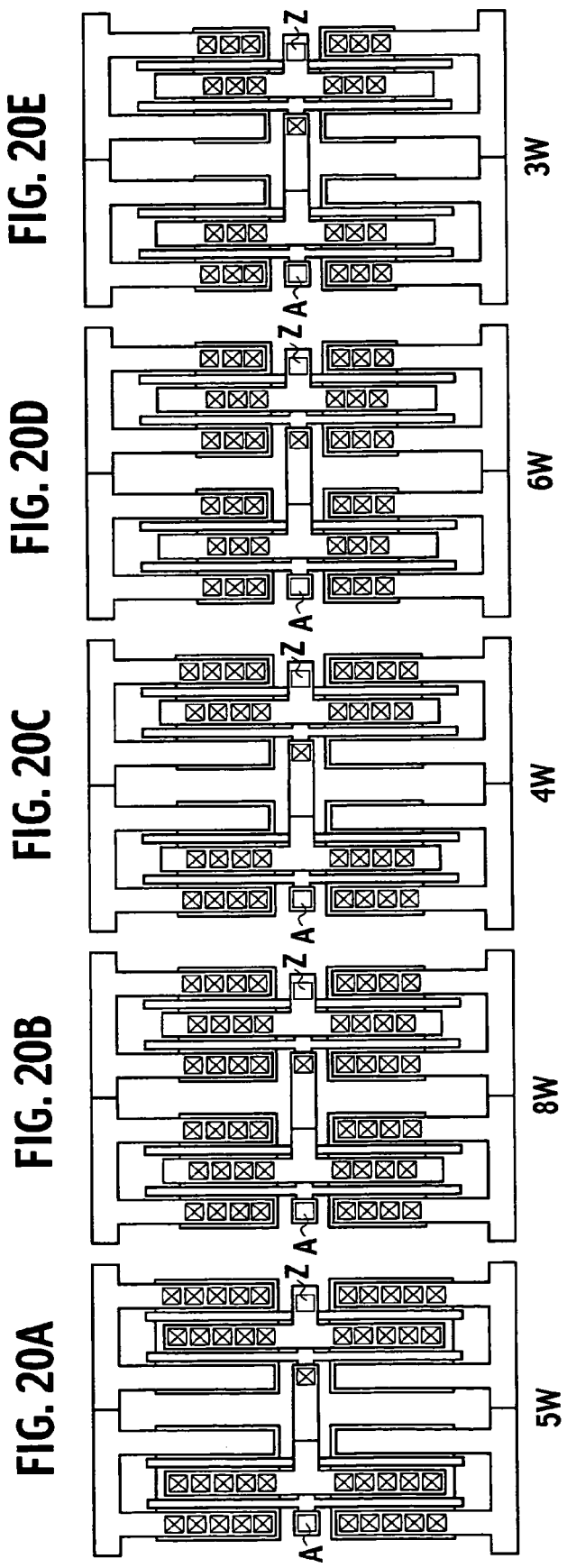

SEMICONDUCTOR CIRCUIT, OPERATING METHOD FOR THE SAME, AND DELAY TIME CONTROL SYSTEM CIRCUIT

CROSS REFERENCE TO RELATED APPLICATIONS AND INCORPORATION BY REFERENCE

This application is based upon and claims the benefit of priority from prior Japanese Patent Application P2004-365568 filed on Dec. 17, 2004; the entire contents of which are incorporated by reference herein.

BACKGROUND OF THE INVENTION

1. Field of the Invention

The present invention relates to a semiconductor circuit. More specifically, it relates to a semiconductor circuit, which allows a timing adjustment after detailed routing without rearrangement and rerouting by using primitive cells (variable delay cells) including a built-in means that adjusts delay time, and which is utilized for cell-based designs.

2. Description of the Related Art

In a conventional synchronous dynamic random access memory (SDRAM), data writing and reading can be successively performed in sync with an external clock while switching banks, which are provided by dividing a memory cell array into multiple banks. Furthermore, a memory operating at a high-speed data rate, such as a double data rate SDRAM (DDR-SDRAM) capable of operating at a double data transfer rate, has recently been in the mainstream. However, an application requiring a random cycle such as a network system needs to accelerate operations in the same bank. A double data rate fast cycle random access memory (DDR-FCRAM) resolves this problem. A DDR-FCRAM is capable of being successively written and read at a high speed in sync with an external clock in units of banks provided by dividing a memory cell array into multiple banks. A DDR-FCRAM is useable for an application such as a network system because it is capable of not only transferring data at a double data rate, but also carrying out a high-speed random cycle operation implemented through improvement of memory cell array operations or using a new writing system.

A DDR interface (I/F), a clock generating circuit and the like require strict timing adjustment. That amount of adjustment is often less than the buffer delay time of a primitive cell. With conventional technology, interconnects are deliberately diverted and relevant cells are deliberately rearranged at long a distance. Therefore, troublesome overheads of rerouting, re-extraction, delay time recalculation and the like occur. Furthermore, not only can the effects of that adjustment not be known until executed, but there may be adverse affects to other portions as well. Moreover, this adjustment method can basically only increase delay, and is equivalent to not having an adjustment method for reducing delay.

A DDR I/F requires strict timing adjustment. For example, there is a constraint where changes in 64-bit data signal arrival time must be within ±150 picoseconds (ps). Even if this constraint is imposed on a conventional engineering design (EDA) tool, it is difficult to be satisfied, thereby requiring manual fine adjustment by analyzing the results from that tool. For example, fine adjustment such as delaying Data [0] by 30 ps and, expediting Data [1] by 40 ps or the like is carried out. However, since the buffer delay value of the primitive cell is about 100 to 200 ps according to a 130 nm process, signal arrival time cannot be delayed by adding a buffer. Thus, delay needs to be adjusted by deliberately diverting interconnects, which increases interconnect capacitance. In order to expedite the signal arrival time, the interproximal interconnect capacitance is reduced by placing a single open track and forming relevant interconnects, or cells are rearranged so that the interconnect lengths can be shortened; however, the results thereof are insignificant. In the case of insufficient improvement in the timing, relaxing constraints or restarting from routing may be necessary. Relaxing constraints may cause wider margins and a decrease in yield, and restarting from routing delays design completion.

An ASIC including multiple clock drivers, which are arbitrarily connectable to a clock signal line and have different correctable driving capabilities (transistor channel widths), is disclosed in Japanese Patent Application Laid-open No. 2001-111391 (see FIGS. 4, 5, 12, and 13).

A delay time adjustment cell library and a delay time adjustment method allows adjustment of off timings without rearrangement and rerouting. This is accomplished by using a delay time adjustment cell library for a group of interconnect cells that include basic cells, transistor cells with multiple basic cells, and interconnect patterns, each connecting between devices within a basic cell or between basic cells. See Japanese Patent Application Laid-open No. 2001-230324, for example.

However, an objective of Japanese Patent Application Laid-open No. 2001-111391 is to adjust a hold margin for clock delay and adjustment of variance due to process variation is not considered. Furthermore, both Japanese Patent Application Laid-open No. 2001-111391 and Japanese Patent Application Laid-open No. 2001-230324 are for making a delay adjustment before or during the process, and do not consider delay adjustment after chip formation.

SUMMARY OF THE INVENTION

An aspect of the present invention inheres in a semiconductor circuit connected between an input pad and an output pad, which includes: a first buffer connected between the input pad and the output pad; and a plurality of capacitances connectable in parallel between a fixed potential and a current flow path positioned between the first buffer and the output pad. A connection between each of the plurality of capacitances and the output pad is controlled.

Another aspect of the present invention inheres in an operating method for a semiconductor circuit which includes: executing detailed routing, a delay extraction, a delay calculation, and a delay analysis for a variable capacitance embedded buffer adjacent the center of a variable width of delay time adjustment; determining whether there is a to-be-delayed delay time of the semiconductor circuit; calculating a to-be-delayed delay time when there is a to-be-delayed delay time as analysis results; calculating a to-be-expedited delay time when there is a to-be-expedited delay time as analysis results; and replacing a referred cell of the semiconductor circuit based on the resulting delay time. The semiconductor circuit is connected between an input pad and an output pad and includes: a first buffer connected between the input pad and the output pad; and a plurality of capacitances connectable in parallel between a fixed potential and a current flow path positioned between the first buffer and the output pad. A connection between each of the plurality of capacitances and the output pad is respectively controlled.

Another aspect of the present invention inheres in a delay time control system circuit, which includes: a plurality of control terminal-equipped/variable capacitance embedded buffers connected between an input pad and an output pad of a semiconductor circuit and configuring the semiconductor circuit including: a first buffer connected between the input pad and the output pad, a plurality of capacitances connectable in parallel between a fixed potential and a current flow path positioned between the first buffer and the output pad, and a plurality of control terminals, each connected in series between a corresponding one of the plurality of capacitances and the output pad, and each individually controlling a connection between a corresponding one of the plurality of capacitances and the output pad so that connection between the corresponding one of the plurality of capacitances and the output pad can be controlled; an externally writable memory; and a plurality of control lines connected between the externally writable memory and each of the plurality of control terminals within the plurality of control terminal-equipped/variable capacitance embedded buffers. The connection of each of the plurality of capacitances connected in parallel between the current flow path and the fixed potential is controlled so as to externally adjust delay time of the plurality of control terminal-equipped/variable capacitance embedded buffers.

BRIEF DESCRIPTION OF DRAWINGS

FIG. 3A is a schematic circuit diagram showing an exemplary variable capacitance connection in a variable capacitance embedded buffer CNIVX8D0, which is the semiconductor circuit according to the first embodiment of the present invention;

FIG. 3B is a schematic circuit diagram showing an exemplary variable capacitance connection in a variable capacitance embedded buffer CNIVX8D1, which is the semiconductor circuit according to the first embodiment of the present invention;

FIG. 3C is a schematic circuit diagram showing an exemplary variable capacitance connection in a variable capacitance embedded buffer CNIVX8D2, which is the semiconductor circuit according to the first embodiment of the present invention;

FIG. 3D is a schematic circuit diagram showing an exemplary variable capacitance connection in a variable capacitance embedded buffer CNIVX8D3, which is the semiconductor circuit according to the first embodiment of the present invention;

FIG. 3E is a schematic circuit diagram showing an exemplary variable capacitance connection in a variable capacitance embedded buffer CNIVX8D4, which is the semiconductor circuit according to the first embodiment of the present invention;

FIG. 3F is a schematic circuit diagram showing an exemplary variable capacitance connection in a variable capacitance embedded buffer CNIVX8D5, which is the semiconductor circuit according to the first embodiment of the present invention;

FIG. 3G is a schematic circuit diagram showing an exemplary variable capacitance connection in a variable capacitance embedded buffer CNIVX8D6, which is the semiconductor circuit according to the first embodiment of the present invention;

FIG. 3H is a schematic circuit diagram showing an exemplary variable capacitance connection in a variable capacitance embedded buffer CNIVX8D7, which is the semiconductor circuit according to the first embodiment of the present invention;

FIG. 4 is a schematic diagram showing output and input data (.Z(Data [63]), .A(net63)) to (.Z(Data [0]), .A(net0)) of buffers iData63 to iData0 when replacing the referred cells based on a to-be-delayed delay time and a to-be-expedited delay time, which are provided through detailed routing, an RC extraction, a delay calculation and a delay analysis using the variable capacitance embedded buffer CNIVX8D4 near the center of the variable width of delay time adjustment;

FIG. 5 is a schematic diagram showing output and input data (.Z(Data [63]), .A(net63)) to (.Z(Data [0]), .A(net0)) of buffers iData63 to iData0 when expediting, for example, Data [63] and Data [62] where the to-be-expedited delay time for Data [63] is greater, while delaying for Data [1] and Data [0] where the to-be-delayed delay time for Data [0] in the variable capacitance embedded buffers CNIVX8D0 to CNIVX8D7 is greater;

FIG. 10A is an operational explanatory diagram of the semiconductor circuit according to the first embodiment of the present invention, schematically showing delay variances among address inputs add [0] to add [7];

FIG. 10B is an operational explanatory diagram of the semiconductor circuit according to the first embodiment of the present invention, schematically showing adjusted delay variances among the address inputs add [0] to add [7];

FIG. 10C is an operational explanatory diagram of the semiconductor circuit according to the first embodiment of the present invention, showing output and input data (.Z(Data [63]), .A(net63)) to (.Z(Data [62]), .A(net62)) of the buffers iData63 and iData62;

FIG. 16A is a schematic circuit diagram showing an exemplary connection allowing a variable driving force buffer, which is a semiconductor circuit according to a third embodiment of the present invention, to be disabled;

FIG. 16B is a schematic circuit diagram showing an exemplary combinational connection in a variable driving force buffer CNIVXVX1, which is the semiconductor circuit according to the third embodiment of the present invention;

FIG. 16C is a schematic circuit diagram showing an exemplary combinational connection in a variable driving force buffer CNIVXVX2, which is the semiconductor circuit according to the third embodiment of the present invention;

FIG. 16D is a schematic circuit diagram showing an exemplary combinational connection in a variable driving force buffer CNIVXVX3, which is the semiconductor circuit according to the third embodiment of the present invention;

FIG. 16E is a schematic circuit diagram showing an exemplary combinational connection in a variable driving force buffer CNIVXVX4, which is the semiconductor circuit according to the third embodiment of the present invention;

FIG. 16F is a schematic circuit diagram showing an exemplary combinational connection in a variable driving force buffer CNIVXVX5, which is the semiconductor circuit according to the third embodiment of the present invention;

FIG. 16G is a schematic circuit diagram showing an exemplary combinational connection in a variable driving force buffer CNIVXVX6, which is the semiconductor circuit according to the third embodiment of the present invention;

FIG. 16H is a schematic circuit diagram showing an exemplary combinational connection in a variable driving force buffer CNIVXVX7, which is the semiconductor circuit according to the third embodiment of the present invention;

FIG. 20A is an aerial view of a schematic layout pattern of a variable driving force buffer with adjustable channel width, which is the semiconductor circuit according to the fifth embodiment of the present invention;

FIG. 20B is an aerial view of a schematic layout pattern of a variable driving force buffer with adjustable channel width, which is the semiconductor circuit according to the fifth embodiment of the present invention;

FIG. 20C is an aerial view of a schematic layout pattern of a variable driving force buffer with adjustable channel width, which is the semiconductor circuit according to the fifth embodiment of the present invention;

FIG. 20D is an aerial view of a schematic layout pattern of a variable driving force buffer with adjustable channel width, which is the semiconductor circuit according to the fifth embodiment of the present invention;

FIG. 20E is an aerial view of a schematic layout pattern of a variable driving force buffer with adjustable channel width, which is the semiconductor circuit according to the fifth embodiment of the present invention;

DETAILED DESCRIPTION OF THE INVENTION

Figure 1:
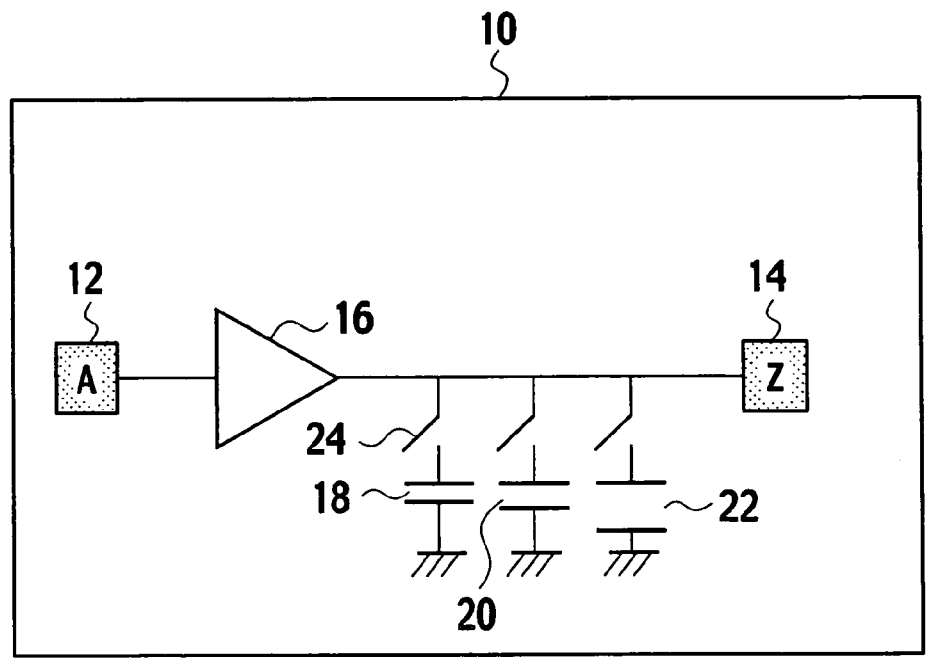
FIG. 1 is a schematic circuit diagram of a variable capacitance embedded buffer, which is a semiconductor circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

Embodiments of the present invention are described forthwith while referencing the drawings. The same or similar symbols are applied to the same or similar parts throughout the appended drawings. However, it should be noted that the drawings are merely schematics, and that the planar dimensions of each block, planar dimensions of each circuitry, each variable transistor width and the like may differ from reality. Furthermore, needless to say that parts with differing dimensions and/or differing ratios may be included among the drawings.

In addition, the embodiments given forthwith illustrate devices and methods for embodying the technical idea of the present invention, and that technical idea of the present invention is not limited to the following arrangements or the like of parts constituting each block. The technical idea of the present invention may be modified into various modifications within the scope of the appended claims.

Semiconductor circuits, according to embodiments of the present invention, use as a basic cell a 'primitive cell with a built-in means for adjusting a delay time'. Hereafter, a 'primitive cell with a built-in means for adjusting a delay time' is duly called a 'variable delay cell (VDC)'. Utilization of a primitive cell with a built-in means for adjusting a delay time allows a timing adjustment after detailed routing without rearrangement and rerouting, adjustment of delay variance due to process variation, and a delay adjustment even after chip formation.

Variable capacitance or driving force may be used for adjustment of delay time of the variable delay cell (VDC) The variable driving force may be provided using a combination of embedded buffer functions, or through adjustment of variable transistor width or transistor channel width. Furthermore, adjustment of delay time of the variable delay cell (VDC) may be made using both variable capacitance and driving force. Moreover, the VDC may have an adjustment terminal used to directly control a delay time adjustment means, which is embedded in the variable delay cell (VDC).

According to the semiconductor circuits of the embodiments of the present invention adjustments can be provided as follows. There may be: (a) adjustment less than the buffer delay time, (b) adjustment reducing delay time, (c) delay time adjustment after chip formation, and (d) deliberate skew adjustment after clock tree synthesis (CTS) The semiconductor circuits according to the embodiments of the present invention can accommodate cells with delays of 100 ps to less than 200 ps by utilizing variable delay cells (VDC), which configure primitive cells and which are capable of making an adjustment of delays to less than the buffer delay time, thereby resolving new technology problems.

The semiconductor circuits according to the embodiments of the present invention provide for delay adjustment even after chip formation. Furthermore, along with progression of micro-fabrication processes such as a 130 nm, a 90 nm, a 65 nm, a 55 nm, and a 45 nm process, variance in data delay occurs in each transistor gate, buffer, inverter and the like; however, the semiconductor circuits according to the embodiments of the present invention provide for adjustment of such variance in data delay.

The semiconductor circuits according to the embodiments of the present invention represent a technology strongly contributing to formation of cells for an analog interface, in particular. More specifically, the semiconductor circuits according to the embodiments of the present invention represent, for the first time, a technology capable of overcoming serious conditions where precise adjustment of data transmission delay of a USB interface and a digital-to-analog converter (DAC) or the like, and further precise adjustment of data transmission delay of a DDR-RAM, a SD-RAM or the like. Conventionally, delay adjustment can be made before or during a chip formation process but cannot be made after chip formation. The semiconductor circuits according to the embodiments of the present invention are capable of being delay-adjusted in a tester mode after chip formation. In other words, delay adjustment is possible when firmware for a chipboard or the like and/or middleware has been implemented.

Furthermore, the semiconductor circuits according to the embodiments of the present invention represent a technology strongly contributing to formation of an analog interface, which is not conventionally considered as a problem for silicon-on-chip (SoC) technology. The semiconductor circuits according to the embodiments of the present invention represent, for the first time, a technology capable of overcoming serious conditions where precise adjustment of data transmission delay of a USB interface and a digital-to-analog converter (DAC) or the like, and further precise adjustment of data transmission delay of a DDR-RAM, a SD-RAM or the like are required. In other words, in a combined technical field of both an analog IP and a high-speed DDR, such as a DDR-RAM and a SD-RAM interfaces, the present technology allows delay time adjustment of an interface requiring precise data delay adjustment, where the present technology does not allow simply to adjust a hold margin for clock delay.

The semiconductor circuits according to the embodiments of the present invention can perform strict data delay adjustment for enhancing operating speed, and adjustment of data delay variances in each inverter, transistor gate, and buffer.

Precise data delay adjustment for speed enhancement of the semiconductor circuits, according to the embodiments of the present invention, so as to expedite data delay can be made by (a) reducing interconnect capacitance, (b) reducing capacitance C by selecting a straight route in a layout pattern, (c) reducing resistance R by widening the gate interconnect pattern width, or (d) minimizing a parasitic capacitance Cp by spacing between adjacent interconnects.

On the other hand, the semiconductor circuits, according to the embodiments of the present invention, can include an improved primitive cell structure that configures a variable delay cell (VDC), to allow fine adjustment of a cell not only of a buffer, so as to finely control delay time. In addition, the semiconductor circuits can include a control terminal within a primitive cell that configures a variable delay cell (VDC) so as to measure a delay time, and then adjust the delay time based on the measurement. The semiconductor circuits with control terminals, according to the embodiments of the present invention, can ensure not only delay time adjustment, but also yield improvement and a satisfactory operating margin.

In the semiconductor circuits, according to the embodiments of the present invention, the variable delay cell (VDC) configuring a primitive cell includes, for example, an eight-valued variable capacitance made up of a parallel circuit with three capacitors differing from each other in value. In the case of a parallel circuit with three capacitors having the same value, only a four-valued variable capacitance is possible, as is apparent from the example in Japanese Patent Application Laid-open No. 2001-111391. In the semiconductor circuits according to the embodiments of the present invention, in view of having arranged different capacitances, a parallel circuit with n capacitors differing from one another in value, which provides a wide variable range, can also secure a range of $2^n$ different variable values.

According to the semiconductor circuits of the embodiments of the present invention, carrying out a logic simulation, an automatic routing tool, a place-and-route tool, detailed routing, an RC extraction, a delay calculation, and a delay analysis, and providing analysis results are possible by combining an engineering design automation tool (EDA) with those semiconductor circuits.

The embodiments of the present invention provides a semiconductor circuit that allows a timing adjustment after detailed routing without rearrangement and rerouting by utilization of a primitive cell with a built-in delay time adjusting means, an adjustment of delay variance due to process variation, and a delay adjustment even after chip formation.

According to the semiconductor circuit of the present invention, a timing adjustment after detailed routing without rearrangement and rerouting can be made, an adjustment of delay variance due to process variation, and a delay adjustment even after chip formation are possible.

First Embodiment (Variable Capacitance Embedded Buffer)

As shown in FIG. 1, in a semiconductor circuit according to a first embodiment of the present invention, a schematic circuitry of a variable capacitance embedded buffer 10 includes: a buffer 16; an input pad (A) 12 connected to the input terminal of the buffer 16; an output pad (Z) 14 connected to the output terminal of the buffer 16; and multiple capacitances 18, 20, and 22 positioned on the output side of the buffer 16, respectively, differ in value, and can be mutually connected in parallel. Adjustment of delay time of the variable capacitance embedded buffer 10 is possible by controlling the connection between each of the multiple capacitances 18, 20, and 22 and the output pad (Z) 14.

Alternatively, switches 24 connected between the output pad (Z) 14 and each of the multiple capacitances 18, 20, and 22 and which control the connection therebetween, may be provided.

The example of FIG. 1 has three capacitances 18, 20, and 22; however, the example is naturally not limited to three.

Figure 2:
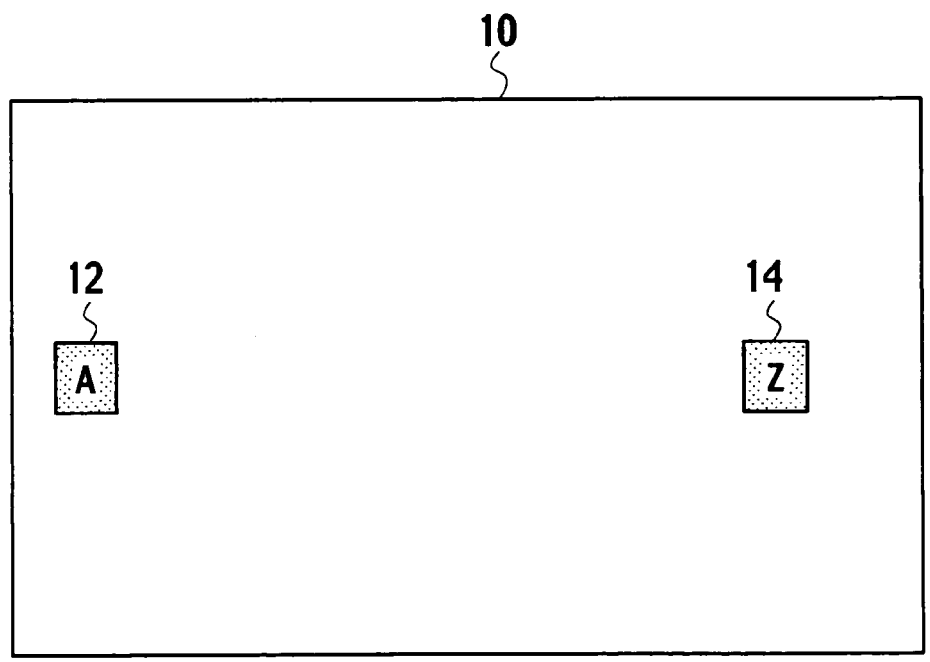
FIG. 2 is a schematic diagram showing an example recognized by a place-and-route tool for the variable capacitance embedded buffer shown in FIG. 1, which is the semiconductor circuit according to the first embodiment of the present invention.

An example recognized by a place-and-route tool for the variable capacitance embedded buffer 10 corresponding to FIG. 1, which is the semiconductor circuit according to the first embodiment of the present invention, can be very simply shown in FIG. 2.

An exemplary variable capacitance connection in the variable capacitance embedded buffer 10 of the semiconductor circuit, according to the first embodiment of the present invention, can be represented by eight different schematic circuit structures as shown in FIGS. 3A to H, which are based on FIG. 1. CNIVX8D0 shown in FIG. 3A represents an example of the variable capacitance embedded buffer 10 without any of the capacitances 18, 20 and 22 connected. CNIVX8D1 shown in FIG. 3B represents an example of the variable capacitance embedded buffer 10 where only the smallest capacitance 22 of the capacitances 18, 20 and 22 is connected. CNIVX8D2 shown in FIG. 3C represents an example of the variable capacitance embedded buffer 10 where only the capacitance 20 of the capacitances 18, 20 and 22 is connected. CNIVX8D3 shown in FIG. 3D represents an example of the variable capacitance embedded buffer 10 where the capacitances 20 and 22 of the capacitances 18, 20 and 22 are connected. CNIVX8D4 shown in FIG. 3E represents an example of the variable capacitance embedded buffer 10 where only the capacitance 18 of the capacitances 18, 20 and 22 is connected. CNIVX8D5 shown in FIG. 3F represents an example of the variable capacitance embedded buffer 10 where the capacitances 18 and 22 of the capacitances 18, 20 and 22 are connected. CNIVX8D6 shown in FIG. 3G represents an example of the variable capacitance embedded buffer 10 where the capacitances 18 and 20 of the capacitances 18, 20 and 22 are connected. CNIVX8D7 shown in FIG. 3H represents an example of the variable capacitance embedded buffer 10 where all of the capacitances 18, 20 and 22 are connected.

The exemplary variable capacitance connection in the variable capacitance embedded buffer 10 of the semiconductor circuit, according to the first embodiment of the present invention, as shown in FIGS. 1 through 3 can create $2^3=8$ types of capacitance depending on whether the three different types of capacitance 18, 20 and 22 are connected to the output pad (Z) 14. Even if a connection is changed so as to change the capacitance, the place-and-route tool recognizes that the positions of the input pad (A) 12 and the output pad (Z) 14 are invariant as shown in FIG. 2. Consequently, in the semiconductor circuit according to the first embodiment of the present invention, eight different variations of the circuitry of the variable capacitance embedded buffer 10 of FIGS. 3A to H may be substituted for each other without affecting arranged interconnects.

(Delay Time Adjustment)

FIG. 4 schematically shows output and input data (.Z(Data [63]), .A(net63)) to (.Z(Data[0]), .A(net0)) of buffers iData63 to iData0 when replacing the referred cell, based on a to-be-delayed delay time and a to-be-expedited delay time, which are provided through detailed routing, an RC extraction, a delay calculation, and a delay analysis using the variable capacitance embedded buffer CNIVX8D4 near the center of the variable width of the delay time adjustment.

FIG. 5 schematically shows output and input data (.Z(Data [63]), .A(net63)) to (.Z(Data [0]), .A(net0)) of buffers iData63 to iData0 when expediting, for example, Data [63] and Data [62] where the to-be-expedited delay time for Data [63] is greater than the delay time for Data [62], while delaying for Data [1] and Data [0] where the to-be-delayed delay time for Data [0] is greater than the delay time for Data [1] in the variable capacitance embedded buffers CNIVX8D0 to CNIVX8D7.

(Operating Method)

Figure 6:
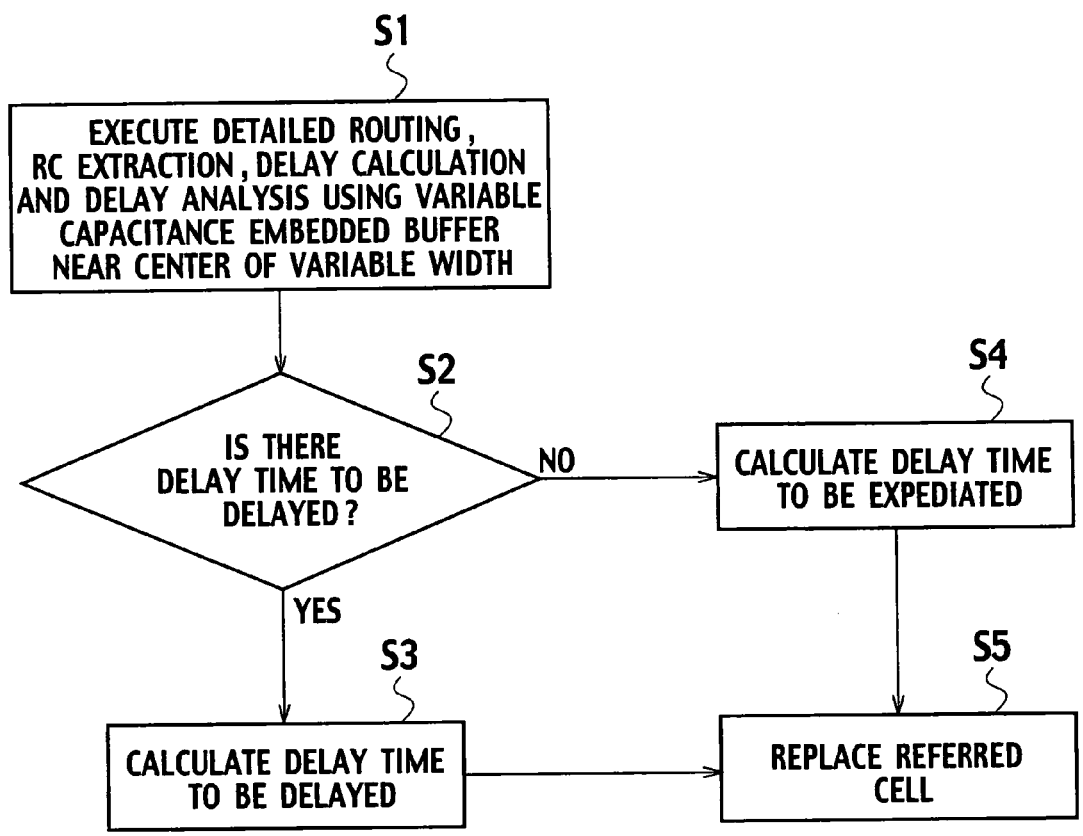
FIG. 6 is a flowchart for the semiconductor circuit operation according to the first embodiment of the present invention.

An operating method of the variable capacitance embedded buffer 10 in the semiconductor circuit according to the first embodiment of the present invention can be represented by a flowchart of FIG. 6.

In step S1, to begin with, the variable capacitance embedded buffer CNIVX8D4 near the center of the variable width of the delay time adjustment executes detailed routing, an RC extraction, a delay calculation and a delay analysis.

In step S2, whether there is a delay time to be delayed is determined.

As a result of the analysis, if the answer is NO in step S2, the delay time to be expedited is obtained in step S4.

As a result of the analysis, if the answer is NO in step S2, the delay time to be expedited is obtained in step S3.

In step S5, the referred cell is replaced based on the resulting delay time.

According to the operating method of the variable capacitance embedded buffer 10 in the semiconductor circuit, according to the first embodiment of the present invention, since replacement of referred cells does not adversely affect existing interconnects at all, fine adjustment of delay time is possible without any processing after detailed routing.

Figure 7A:
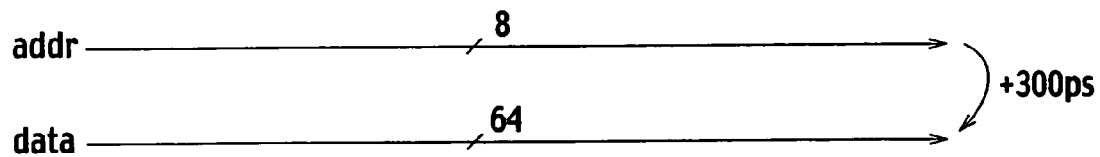
FIG. 7A is an explanatory diagram of the semiconductor circuit operation according to the first embodiment of the present invention, showing delay between address input addr and data output data.
Figure 7B:
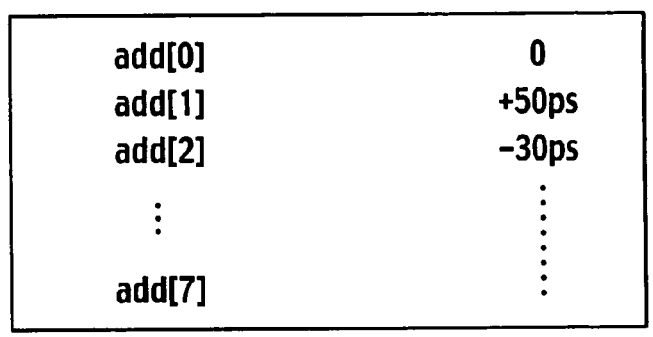
FIG. 7B is an operational explanatory diagram of the semiconductor circuit according to the first embodiment of the present invention, schematically showing delay variances among address inputs add [0] to add [7]
Figure 7C:
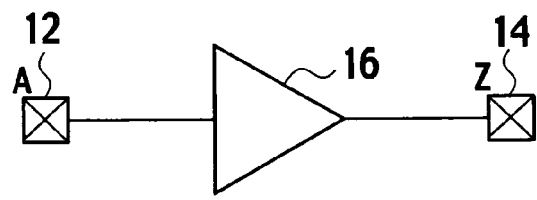
FIG. 7C is an operational explanatory diagram of the semiconductor circuit according to the first embodiment of the present invention, schematically showing an input pad A12 and an output pad Z14 for a buffer 16.
Figure 7D:
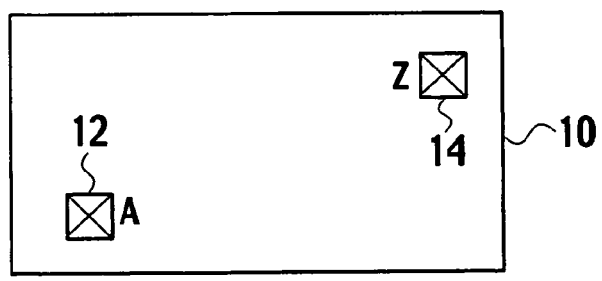
FIG. 7D is an operational explanatory diagram of the semiconductor circuit according to the first embodiment of the present invention, showing an example recognized by a place-and-route tool.

The delay between address input addr and data output data is schematically shown in FIG. 7A as a description of a delay operation of the semiconductor circuit according to the first embodiment of the present invention. Furthermore, delay variances among address inputs add [0] to add [7] are schematically shown in FIG. 7B. The input pad A12 and the output pad Z14 for the buffer 16 are schematically shown in FIG. 7C. An example recognized by the place-and-route tool is schematically shown in FIG. 7D.

(Clock Tree Synthesis: CTS)

Figure 8:
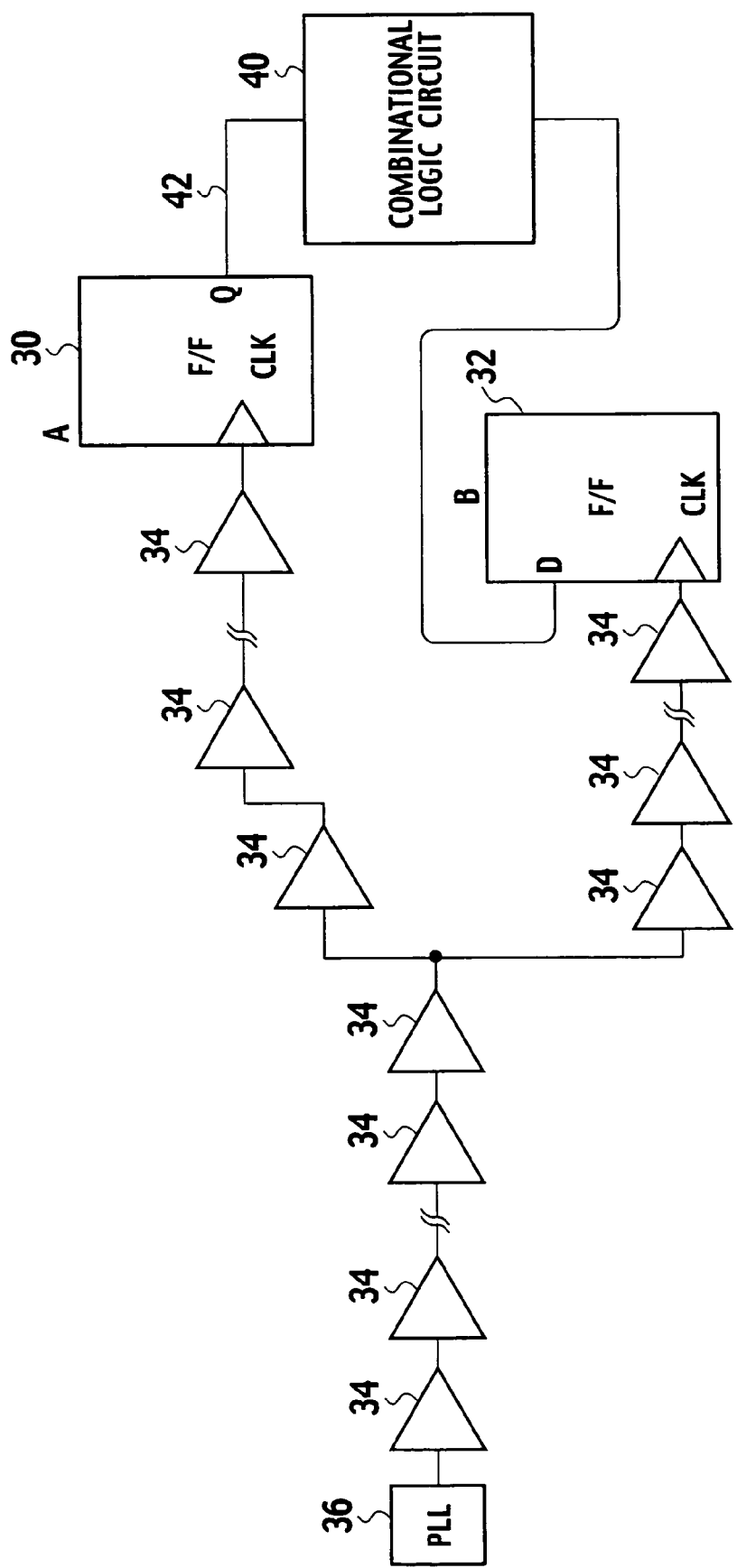
FIG. 8 is a circuit diagram describing a deliberate skew adjustment for clock tree synthesis (CTS)

A circuit diagram describing deliberate skew adjustment for clock tree synthesis (CTS) is shown in FIG. 8.

For example, in a clock tree made up of a PLL 36 as a clock source, multiple buffers 34, a flip flop (F/F) A30 and a flip flop (F/F) B32, clock input terminals CLK of respective F/F A30 and F/F B32 have data delays, which can be adjusted so as to deliberately adjust a clock skew.

Figure 9:
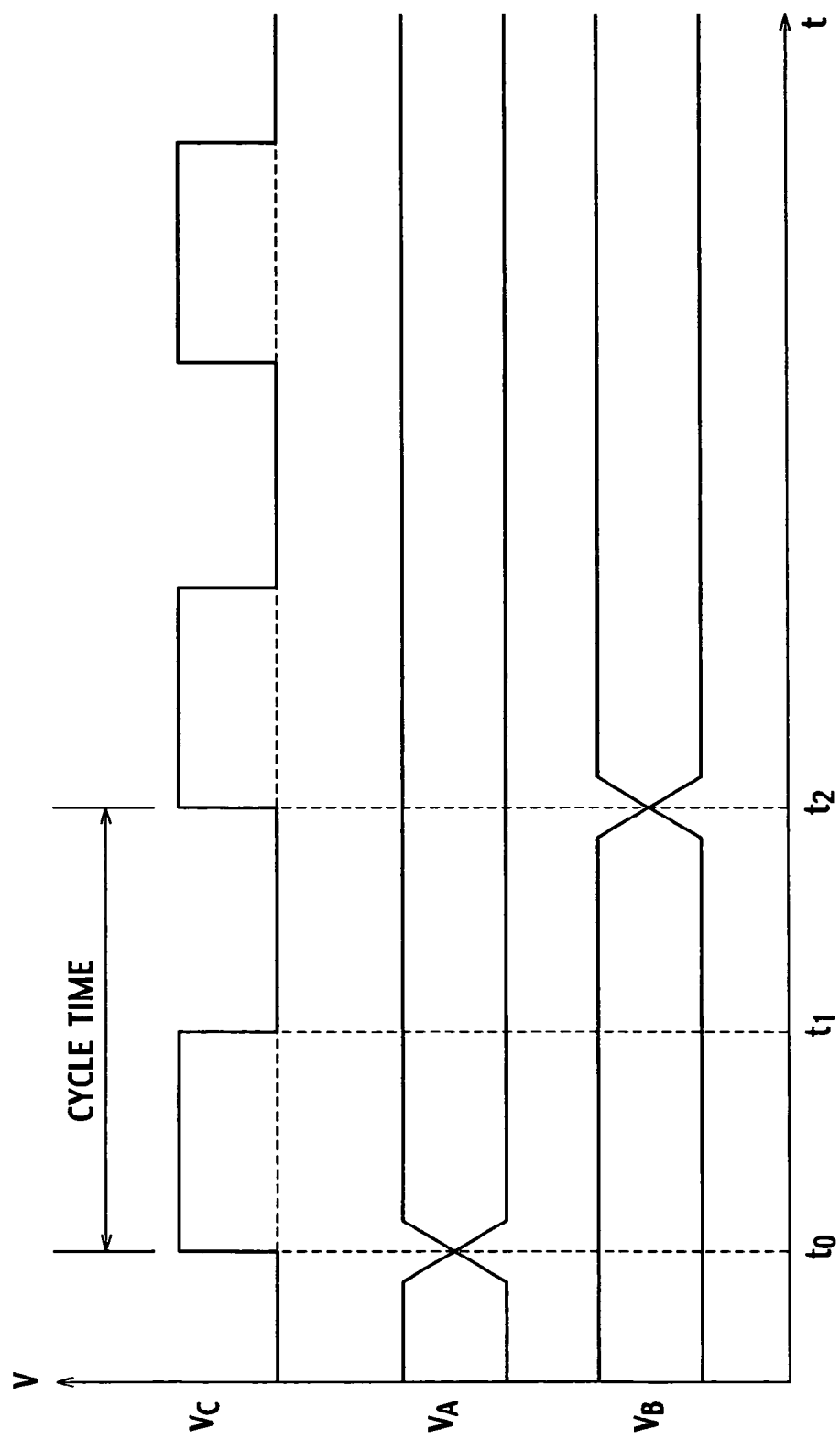
FIG. 9 is an operational waveform schematic diagram describing a deliberate skew adjustment for the clock tree synthesis (CTS) shown in FIG. 8.

The F/F A30 and F/F B32 include a clock input terminal CLK, and a data input terminal D and a data output terminal Q, respectively. The operating waveforms for the circuit diagram shown in FIG. 8 are schematically shown in FIG. 9. Data waveform $V_A$ for the F/F A30 and data waveform $V_B$ for the F/F B32 are schematically shown relative to clock signal waveform $V_C$. In FIG. 9, a cycle time refers to a time period between clock leading edges; for example, if $t_0$=0 ns and $t_2$=10 ns, the cycle time is 10 ns (100 MHz).

Data output from the output terminal Q of the F/F A30 needs to reach the input terminal D of the next F/F B32 within the cycle time via a combination logic circuit 40, which is arranged along a route 42. A skew is the clock time difference from the clock source such as the PLL 36 to the clock terminal CLK.

EXAMPLE 1

When delays from the PLL 36 to the clock terminal CK of the F/F A30 and from the PLL 36 to the clock terminal CK of the F/F B32 are both 3.456 ns, the skew is 0 ns.

EXAMPLE 2

When a delay from the PLL 36 to the clock terminal CK of the F/F A30 is 3.456 ns and delay from the PLL 36 to the clock terminal CK of the F/F B32 is 3.000 ns, the skew is −0.456 ns.

EXAMPLE 3

When a delay from the PLL 36 to the clock terminal CK of the F/F A30 is 3.456 ns and delay from the PLL 36 to the clock terminal CK of the F/F B32 is 4.000 ns, the skew is +0.544 ns.

Typically, CTS is carried out such that the skew can be minimized. In the case of a negative skew as in Example 2 (when a clock for receiving data is faster), set up characteristics deteriorate and the maximum operating frequency decreases. In the case of a positive skew as in Example 3 (when the clock for receiving data is slower), hold characteristics deteriorate, resulting in malfunctions.

Even if CTS is ideally carried out as in Example 1, if the delay from the output terminal Q of the F/F A30 to the input terminal D of the next F/F B32 only reaches 10.111 ns, the operating frequency then becomes 98.9 MHz (10.111 ns) instead of 100 MHz (10 ns). However, deliberately delaying the clock for the F/F B23 that receives data by 0.111 ns allows a 100 MHz (10 ns) operation.

If the variable delay cell, according to the first embodiment of the present invention, is used for a clock tree, the clock can be deliberately delayed after clock tree formation. The same results may be obtained by deliberately expediting the clock for the F/F A30 that outputs data.

The semiconductor circuit according to the first embodiment of the present invention allows delay time adjustment. When the delay variances among the address inputs add [0] to add [7] relative to a specified data delay td are schematically shown in FIG. 10A, the results of adjusting the delay variances among the address inputs add [0] to add [7] can be schematically shown in FIG. 10B. Such delay time adjustment may be made by, for example as shown in FIG. 10C, adjusting the output and input data (.Z(Data [63]), .A(net63)) to (.Z(Data [62]), .A(net62)) of the buffers iData63 and iData62 that correspond to CNIVX8D4, shown in FIG. 3E.

According to the semiconductor circuit of the first embodiment of the present invention, use of a variable capacitance embedded buffer as a primitive cell with a built-in means for adjusting delay time allows a timing adjustment after detailed routing without rearrangement and rerouting, an adjustment of delay variance due to process variation, and a delay adjustment even after chip formation.

Second Embodiment (Control Terminal-Equipped/Variable Capacitance Embedded Buffer)

Figure 11:
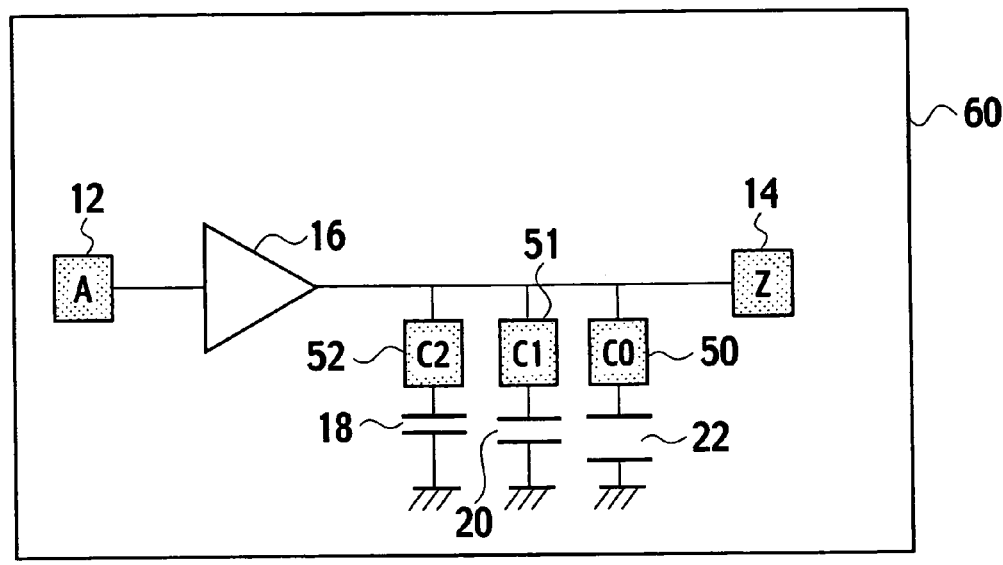
FIG. 11 is a schematic circuit diagram of a control terminal-equipped/variable capacitance embedded buffer, which is a semiconductor circuit according to a second embodiment of the present invention.

In a semiconductor circuit, according to a second embodiment of the present invention, the schematic circuitry of a control terminal-equipped/variable capacitance embedded buffer 60, as shown in FIG. 11, includes: a buffer 16; an input pad (A) 12 connected to the input terminal of the buffer 16; an output pad (Z) 14 connected to the output terminal of the buffer 16; multiple capacitances 18, 20, and 22 positioned on the output side of the buffer 16, respectively, which differ in value, and can be mutually connected in parallel; and control terminals (C2) 52, (C1) 51, (C0) 50 connected between the output pad (Z) 14 and each of the multiple capacitances 18, 20, and 22 and which control each connection therebetween.

The example of FIG. 11 has three capacitances 18, 20, and 22; however, the example is naturally not limited to three capacitances.

Figure 12:
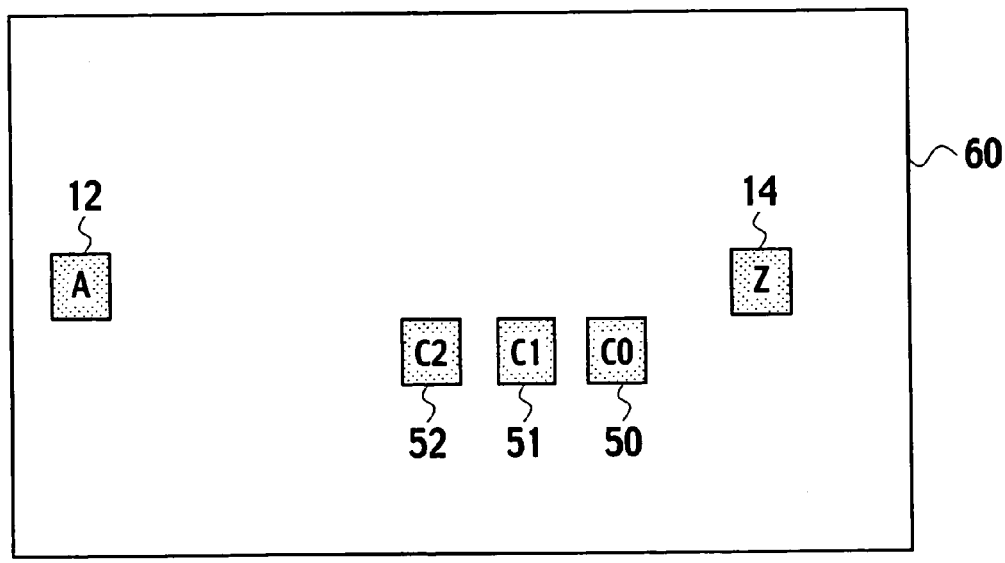
FIG. 12 is a schematic diagram showing an example recognized by a place-and-route tool for the control terminal-equipped/variable capacitance embedded buffer corresponding to FIG. 11, which is the semiconductor circuit according to the second embodiment of the present invention.

An example using a place-and-route tool for the control terminal-equipped/variable capacitance embedded buffer 10 corresponding to FIG. 11 can be very simply shown in FIG. 12.

The control terminals (C2) 52, (C1) 51, (C0) 50 are used to connect or disconnect the embedded capacitances 18, 20, and/or 22 to or from the output pad (Z) 14, respectively. Turning these control terminals (C2) 52, (C1) 51, and/or (C0) 50 on or off allows a connection or disconnection.

(Delay Time Control System Circuit)

Figure 13:
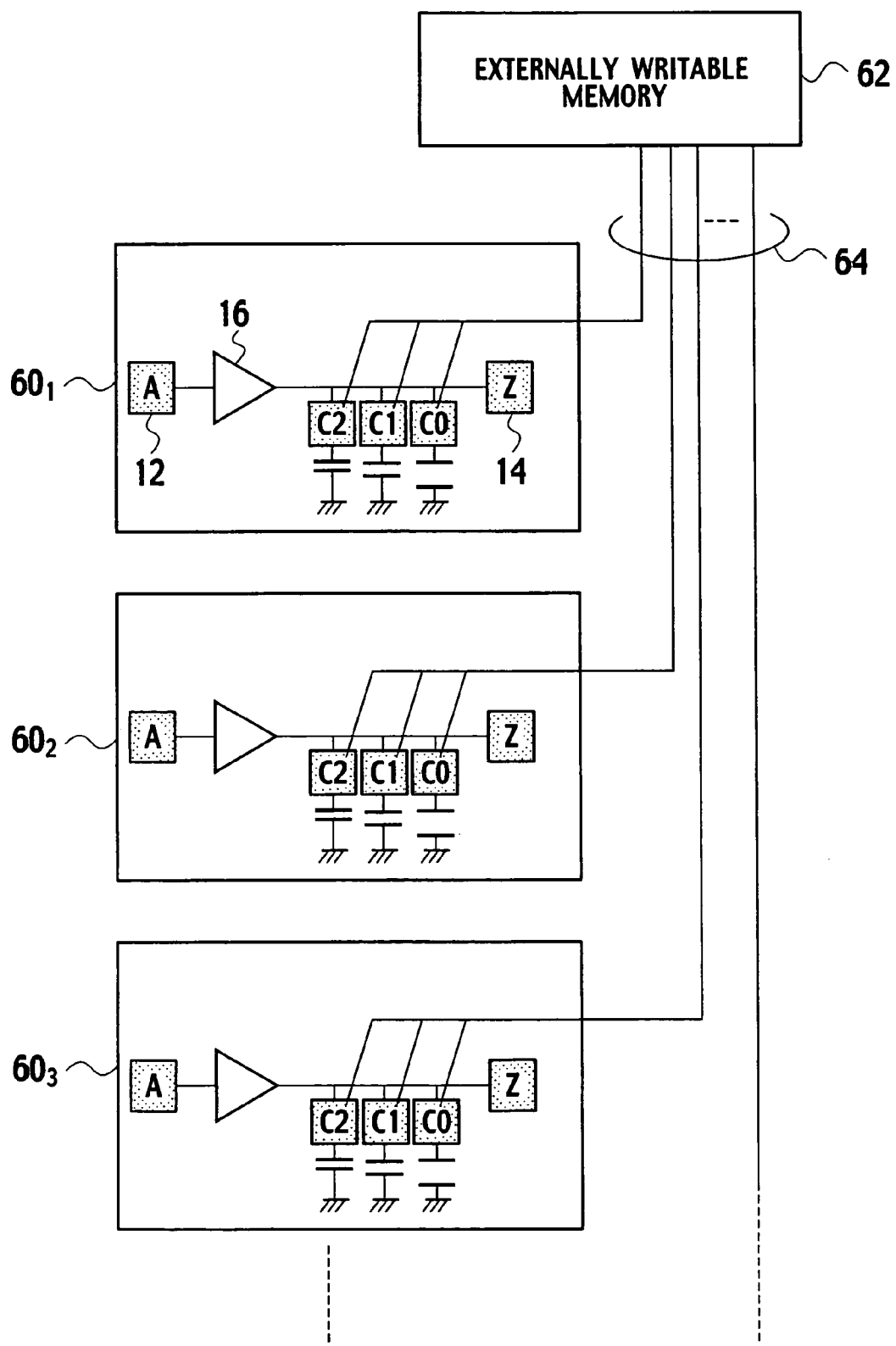
FIG. 13 is a schematic circuit diagram of a delay time control system circuit, which is an application example of the semiconductor circuit according to the second embodiment of the present invention, showing arrangement of a plurality of the control terminal-equipped/variable capacitance embedded buffer and how to control using an external writable memory.

As an application example of the semiconductor circuit according to the second embodiment of the present invention, a delay time control system circuit, as shown in FIG. 13, includes: multiple control terminal-equipped/variable capacitance embedded buffers $60_1$, $60_2$, $60_3$ . . . ; an externally writable memory 62; and multiple control lines 64 connected between the externally writable memory 62 and each of the control terminals (C2) 52, (C1) 51, and (C0) 50 within the multiple control terminal-equipped/variable capacitance embedded buffers $60_1$, $60_2$, $60_3$ . . . . Delay time of the multiple control terminal-equipped/variable capacitance embedded buffers $60_1$, $60_2$, $60_3$ . . . can be adjusted.

As shown in FIG. 13, by configuring these control terminals (C2) 52, (C1) 51, (C0) 50 within the multiple control terminal-equipped/variable capacitance embedded buffers $60_1$, $60_2$, $60_3$ . . . controllable from an externally writable memory device such as nonvolatile memory, a delay time adjustment is possible even after chip formation and even after the chip is mounted on a board and incorporated into an application system.

According to the semiconductor circuit of the second embodiment of the present invention, use of a variable capacitance embedded buffer as a primitive cell with a built-in means for adjusting delay time allows a timing adjustment after detailed routing without rearrangement and rerouting, an adjustment of delay variance due to process variation, and a delay adjustment even after chip formation.

Third Embodiment (Variable Driving Force Buffer)

Figure 14:
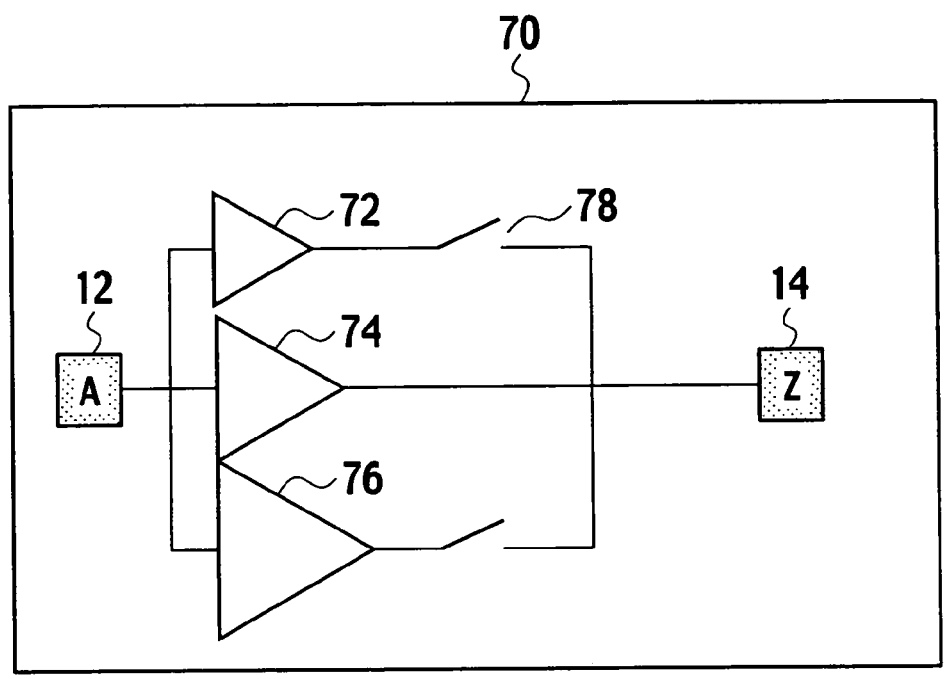
FIG. 14 is a schematic circuit diagram of a variable driving force buffer, which is a semiconductor circuit according to a third embodiment of the present invention.

As a semiconductor circuit according to a third embodiment of the present invention, a schematic circuitry of a variable driving force buffer 70, as shown in FIG. 14, includes: multiple buffers 72, 74, and 76, which respectively differ in driving force, and can be mutually connected in parallel; an input pad (A) 12 connected to the input terminals of the multiple buffers 72, 74, and 76; an output pad (Z) 14 connected to the output terminals of the multiple buffers 72, 74, and 76; and switches connected between the output pad (Z) 14 and each of the output terminals of the multiple buffers 72, 74, and 76, and which control each connection therebetween. An adjustment of delay time of the variable driving force buffer 70 is possible by controlling the connection between each of the multiple buffers 72, 74, and 76 and the output pad (Z) 14.

An exemplary configuration where only the buffer 74 is connected to the output pad (Z) 14 is given in the example of FIG. 14; however, it is apparent that the present invention is not limited thereto. The example of FIG. 14 has three buffers 72, 74, and 76; however, it is naturally not limited to three buffers.

An example using a place-and-route tool for the variable driving force buffer 70 corresponding to FIG. 14 can be very simply shown in FIG. 2.

An exemplary combination connection of variable driving forces of the variable driving force buffer 70, which is the semiconductor circuit according to the third embodiment of the present invention, is represented by eight different schematic circuits, as shown in FIGS. 16A to H. The configuration shown in FIG. 16A represents an example of a disabled variable capacitance embedded buffer 70 where none of the buffers 72, 74 and 76 are connected. CNIVXVX1 shown in FIG. 16B represents an example of the variable driving force buffer 70 where only the buffer 72 having the smallest driving force among the buffers 72, 74 and 76 is connected. CNIVXVX2 shown in FIG. 16C represents an example of the variable driving force buffer 70 where only the buffer 74 of the buffers 72, 74 and 76 is connected. CNIVXVX3 shown in FIG. 16D represents an example of the variable driving force buffer 70 where the buffers 72 and 74 of the buffers 72, 74 and 76 are connected. CNIVXVX4 shown in FIG. 16E represents an example of the variable driving force buffer 70 where only the buffer 76 of the buffers 72, 74 and 76 is connected. CNIVXVX5 shown in FIG. 16F represents an example of the variable driving force buffer 70 where the buffers 72 and 76 of the buffers 72, 74 and 76 are connected. CNIVXVX6 shown in FIG. 16G represents an example of the variable driving force buffer 70 where the buffers 74 and 76 of the buffers 72, 74 and 76 are connected. CNIVXVX7 shown in FIG. 16H represents an example of the variable driving force buffer 70 where all of the buffers 72, 74 and 76 are connected.

Figure 15:
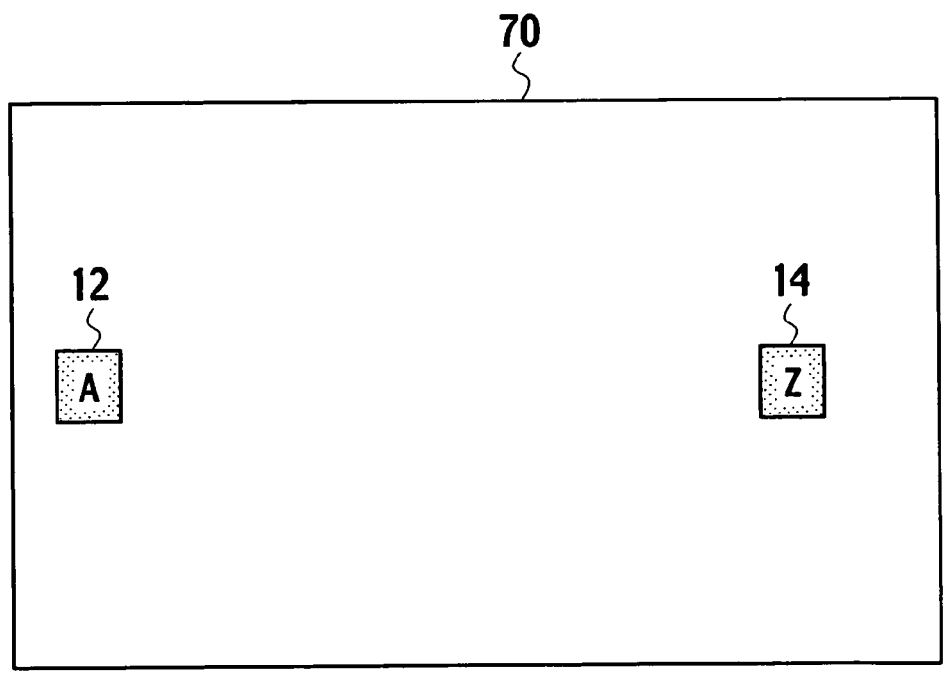
FIG. 15 is a schematic diagram showing an example recognized by a place-and-route tool for the variable driving force buffer corresponding to FIG. 14, which is the semiconductor circuit according to the third embodiment of the present invention.

The exemplary variable capacitance connection in the variable driving force buffer 70, which is the semiconductor circuit according to the third embodiment of the present invention as shown in FIGS. 14 through 16, can create $2^3-1=7$ types of driving forces depending on whether or not the three different types of buffers 72, 74 and 76 are embedded and connected to the output pad (Z) 14. Even if a connection is changed so as to change the driving force, the place-and-route tool recognizes that the terminal positions of the input pad (A) 12 and the output pad (Z) 14 are unchanged, as shown in FIG. 15. Consequently, as the semiconductor circuit according to the third embodiment of the present invention, seven different variations of the circuitry of the variable driving force buffer 70 of FIGS. 16B to H may be substituted for each other without affecting arranged interconnects.

According to the semiconductor circuit, of the third embodiment of the present invention, use of a variable driving force buffer as a primitive cell with a built-in means for adjusting delay time allows a timing adjustment after detailed routing without rearrangement and rerouting, which has been conventionally, effectively impossible without requiring rearrangement and rerouting.

Fourth Embodiment (Control Terminal-Equipped Variable Driving Force Buffer)

Figure 17:
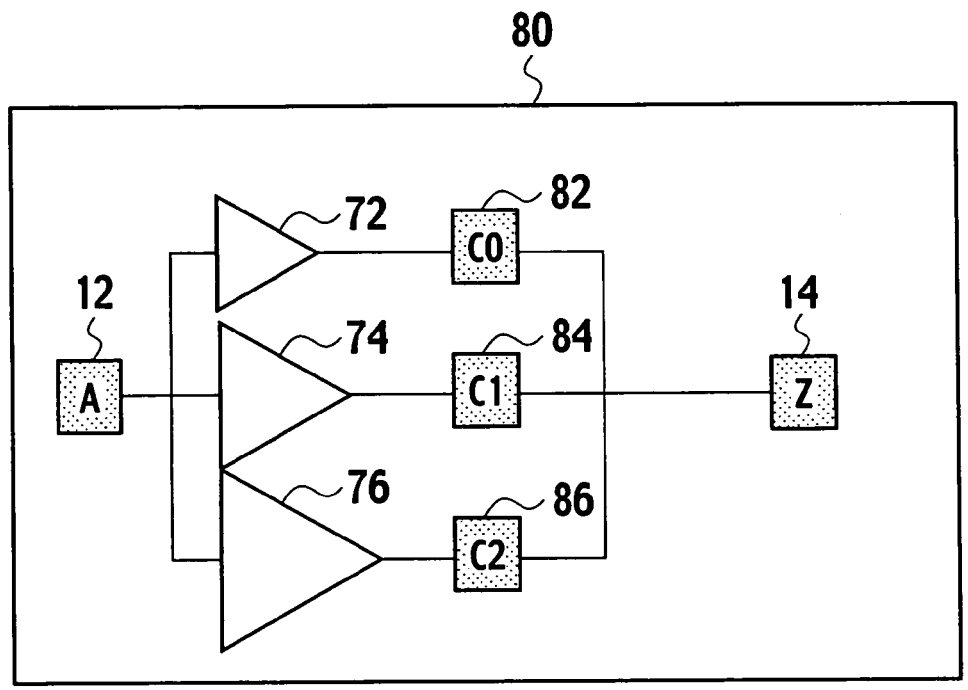
FIG. 17 is a schematic circuit diagram of a control terminal-equipped variable driving force buffer, which is a semiconductor circuit according to a fourth embodiment of the present invention.

As a semiconductor circuit according to a fourth embodiment of the present invention, a schematic circuitry of a control terminal-equipped variable driving force buffer 80, as shown in FIG. 17, includes: multiple buffers 72, 74, and 76, which respectively differ in driving force, and can be mutually connected in parallel; an input pad (A) 12 connected to the input terminals of the multiple buffers 72, 74, and 76; an output pad (Z) 14 connected to the output terminals of the multiple buffers 72, 74, and 76; and control terminals (C2) 86, (C1) 84, (C0) 82 connected between the output pad (Z) 14 and each of the output terminals of the multiple buffers 72, 74, and 76 and are for controlling each connection therebetween. An adjustment of delay time of the variable driving force buffer 80 is possible by controlling connection between each of the multiple buffers 72, 74, and 76 and the output pad (Z) 14.

The example of FIG. 17 has three buffers 72, 74, and 76; however, it is naturally not limited to three buffers.

Figure 18:
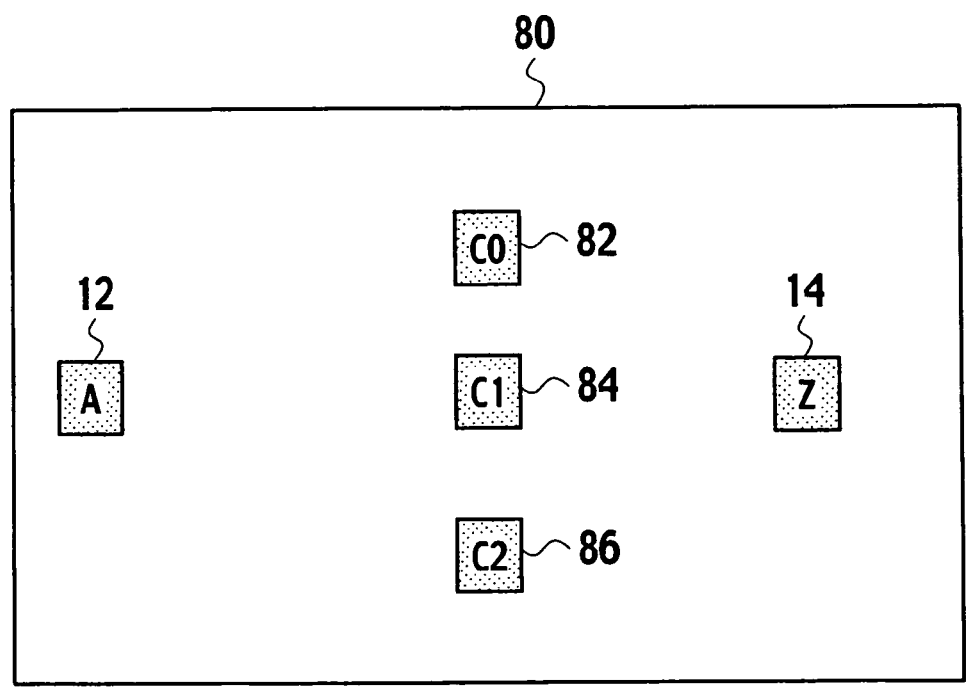
FIG. 18 is a schematic diagram showing an example recognized by a place-and-route tool for the control terminal-equipped variable driving force buffer corresponding to FIG. 17, which is the semiconductor circuit according to the fourth embodiment of the present invention.

An example of a place-and-route tool for the control terminal-equipped variable driving force buffer 80 corresponding to FIG. 17, which is the semiconductor circuit according to the fourth embodiment of the present invention, can be very simply shown in FIG. 18.

According to the semiconductor circuit of the fourth embodiment of the present invention, use of the control terminal-equipped variable driving force buffer 80 as a primitive cell with a built-in means for adjusting delay time allows a timing adjustment after detailed routing without rearrangement and rerouting, an adjustment of delay variance due to process variation, and a delay adjustment even after chip formation.

Fifth Embodiment (Variable Driving Force Buffer with Adjustable Channel Width)

A buffer driving force can adjust and vary the channel width of a transistor configuring the buffer.

Figure 19A:
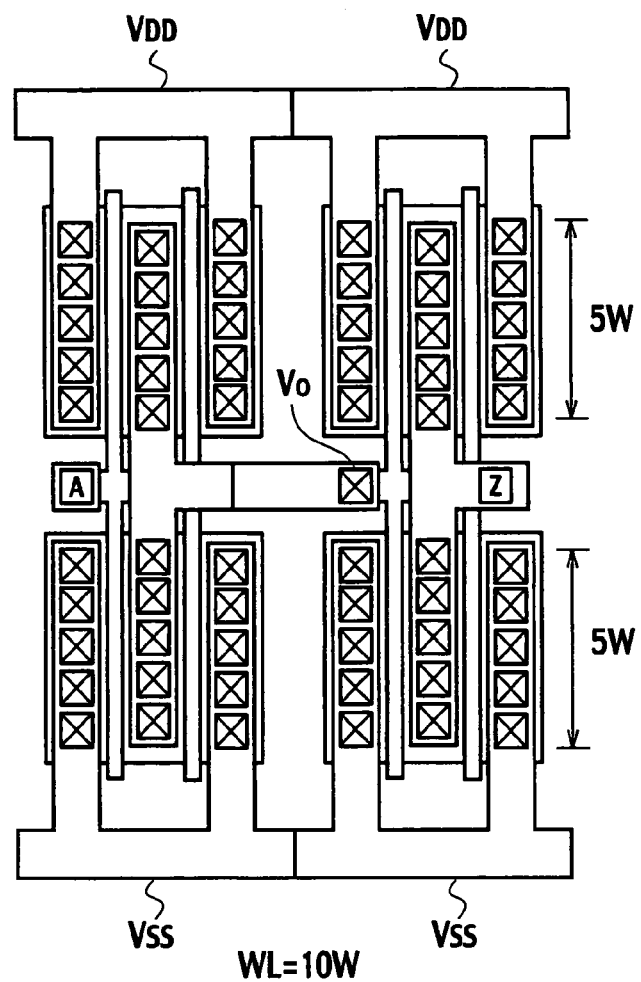
FIG. 19A is an aerial view of a schematic layout pattern of a variable driving force buffer with adjustable channel width, which is a semiconductor circuit according to a fifth embodiment of the present invention.
Figure 19B:
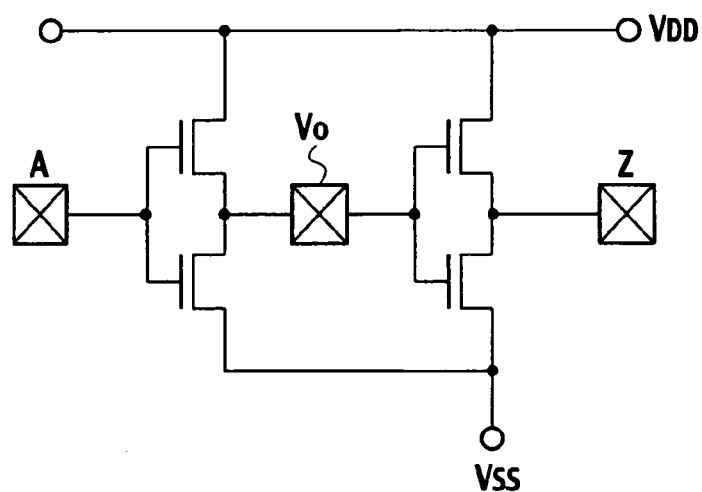
FIG. 19B is a schematic circuit diagram of the variable driving force buffer with adjustable channel width, which is the semiconductor circuit according to the fifth embodiment of the present invention.

A top view of a schematic layout pattern of a variable driving force buffer with adjustable channel width WL, as shown in FIG. 19A, includes a buffer configured with two stages of inverter that are connected to each other and made up of MOS transistors with a specified channel width (for example, 5W×2=10W), an input pad A connected to the input terminal of the buffer, and an output pad Z connected to the output terminal of the buffer. In this case, W is a unit for channel width corresponding to the width of a contact hole to be arranged in a source region or a drain region. Load side MOS transistors are connected to a power source voltage $V_{DD}$, and drive side MOS transistors are connected to a low potential power source $V_{SS}$. $V_0$ denotes the output voltage of the first inverter. A schematic circuitry shown in FIG. 19B corresponds to FIG. 19A, and includes a buffer that is configured with two MOS inverters connected to each other and connected to the power source voltage $V_{DD}$ and the low potential power source $V_{SS}$, an input pad A of the buffer, and an output pad Z of the buffer. Furthermore, five types of schematic device top view patterns of the variable driving force buffer, according to the fifth embodiment of the present invention and are capable of adjusting MOS transistor channel width WL, can be provided by adjusting the length of the gate electrode of each MOS transistor, as shown in FIGS. 20A to E. FIGS. 20A to 20E correspond to cases where the channel width WL is equal to 5W, 8W, 4W, 6W and 3W, respectively. An adjustment of the channel width WL of the MOS transistors allows an adjustment of mutual conductance gm of the MOS transistors, and an adjustment of driving forces is possible when configuring a buffer. The variable driving force buffer with adjustable channel width WL configures the semiconductor circuit according to the fifth embodiment of the present invention.

According to the semiconductor circuit of the fifth embodiment of the present invention, use of the variable driving force buffer with adjustable channel width WL as a primitive cell with a built-in means for adjusting delay time allows a timing adjustment after detailed routing without rearrangement and rerouting, an adjustment of delay variance due to process variation, and a delay adjustment even after chip formation.

Sixth Embodiment (Variable Capacitance/Variable Driving Force Embedded Buffer)

Figure 21A:
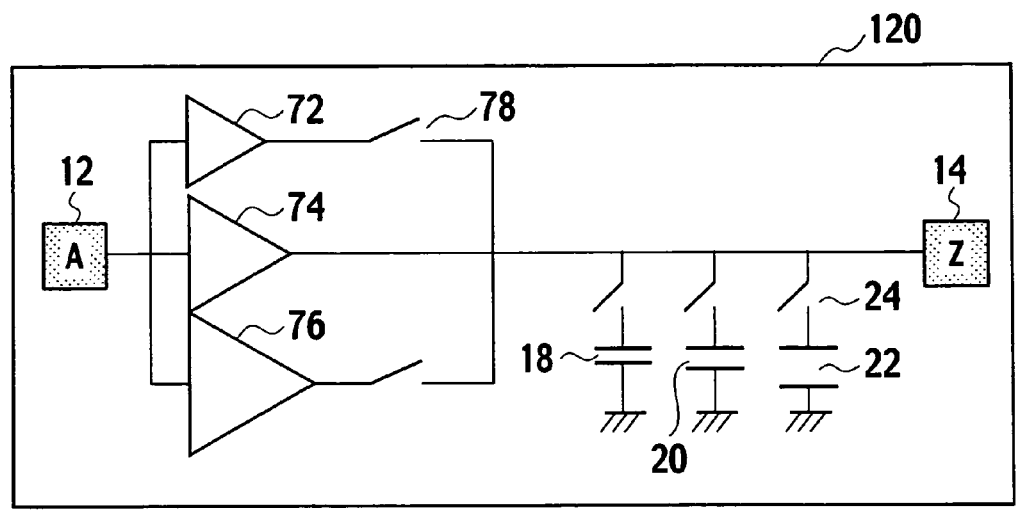
FIG. 21A is a schematic circuit diagram of a variable capacitance/variable driving force embedded buffer, which is a semiconductor circuit according to a sixth embodiment of the present invention.

A schematic circuitry of a variable capacitance/variable driving force embedded buffer 120 shown in FIG. 21A is a semiconductor circuit according to a sixth embodiment of the present invention, and includes: multiple buffers 72, 74, and 76, respectively differing in driving force, and mutually connected in parallel; an input pad (A) 12 connected to the input terminals of the multiple buffers 72, 74, and 76; an output pad (Z) 14 connected to the output terminals of the multiple buffers 72, 74, and 76; switches 78 connected between the output pad (Z) 14 and each of the multiple buffers 72, 74, and 76 and which control each connection therebetween; multiple capacitances 18, 20, and 22 positioned on the output side of the multiple buffers 72, 74, and 76, respectively differing in value, and mutually connected in parallel; and switches 24 connected between the output pad (Z) 14 and each of the multiple capacitances 18, 20, and 22 and which control each connection therebetween. An adjustment of delay time of the variable capacitance/variable driving force embedded buffer 120 is possible by controlling the connection between each of the multiple capacitances 18, 20, and 22 and the output pad (Z) 14.

An exemplary configuration where only the buffer 74 is connected to the output pad (Z) 14 is given in the example of FIG. 21A; however, it is apparent that the present invention is not limited thereto. As shown in FIG. 16, seven different types of connections for the buffers 72, 74, and 76 are possible, as an example.

An example of a place-and-route tool for the variable capacitance/variable driving force embedded buffer 120 corresponding to FIG. 21A can be very simply shown in FIG. 2.

The example of FIG. 21A has three capacitances 18, 20, and 22; however, it is naturally not limited to three capacitances. Furthermore, the example of FIG. 21A has three buffers 72, 74, and 76; however, it is naturally not limited to three buffers.

(Variable Capacitance/Control Terminal-Equipped Variable Driving Force Buffer)

Figure 21B:
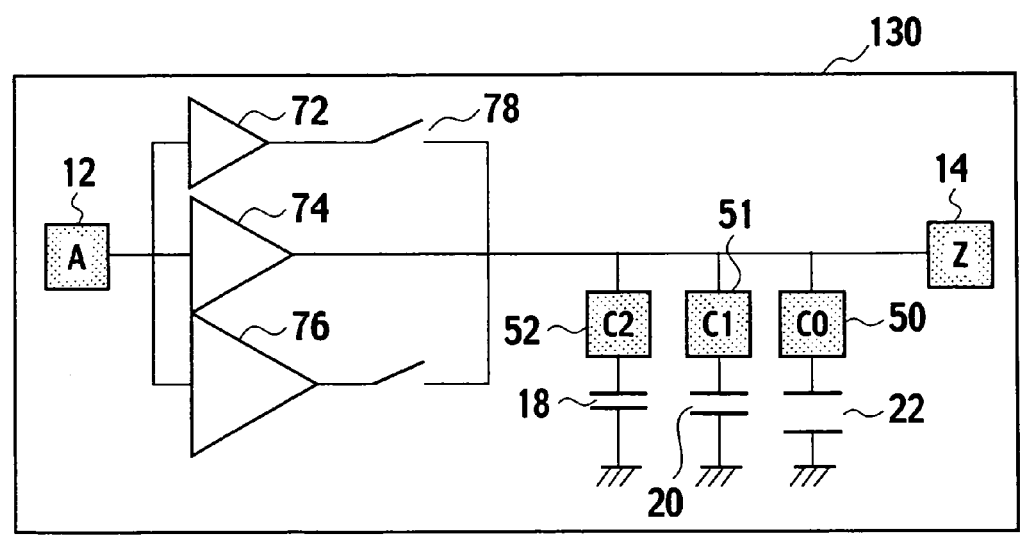
FIG. 21B is a schematic circuit diagram of a variable capacitance/control terminal-equipped variable driving force buffer, which is a semiconductor circuit according to a modified example of the sixth embodiment of the present invention.

As the semiconductor circuit according to the sixth embodiment of the present invention, a schematic circuitry of a variable capacitance/control terminal-equipped variable driving force buffer 130, as shown in FIG. 21B, includes: multiple buffers 72, 74, and 76, which respectively differ in driving force, and mutually connected in parallel; an input pad (A) 12 connected to the input terminals of the multiple buffers 72, 74, and 76; an output pad (Z) 14 connected to the output terminals of the multiple buffers 72, 74, and 76; switches 78 connected between the output pad (Z) 14 and each of the multiple buffers 72, 74, and 76, and which control the connection therebetween; multiple capacitances 18, 20, and 22 positioned on the output side of the multiple buffers 72, 74, and 76, respectively differing in value, and mutually connected in parallel; and control terminals (C2) 52, (C1) 51, and (C0) 50 connected between the output pad (Z) 14 and each of the multiple capacitances 18, 20, and 22 and which control the connection therebetween. Adjustment of delay time of the variable capacitance/variable driving force embedded buffer 130 is possible by controlling the connection between each of the multiple capacitances 18, 20, and 22 and the output pad (Z) 14.

An exemplary configuration where only the buffer 74 is connected to the output pad (Z) 14 is given in the example of FIG. 21B; however, it is apparent that the present invention is not limited thereto. As shown in FIG. 16, seven different types of connections are possible for the buffers 72, 74, and 76, as an example.

An example of a place-and-route tool for the variable capacitance/control terminal-equipped variable driving force buffer 130 corresponding to FIG. 21B, can be very simply shown in FIG. 12.

The example of FIG. 21 has three capacitances 18, 20, and 22; however, it is naturally not limited to three capacitances. Furthermore, the example of FIG. 21 has three buffers 72, 74, and 76; however, it is naturally not limited to three buffers.

According to the semiconductor circuit of the sixth embodiment of the present invention, use of a variable capacitance/variable driving force embedded buffer or a variable capacitance/control terminal-equipped variable driving force buffer as a primitive cell with a built-in means for adjusting delay time allows a timing adjustment after detailed routing without rearrangement and rerouting, an adjustment of delay variance due to process variation, and a delay adjustment even after chip formation.

Seventh Embodiment (Variable Capacitance Embedded Buffer Configured by Two Stages of Inverter)

Figure 22:
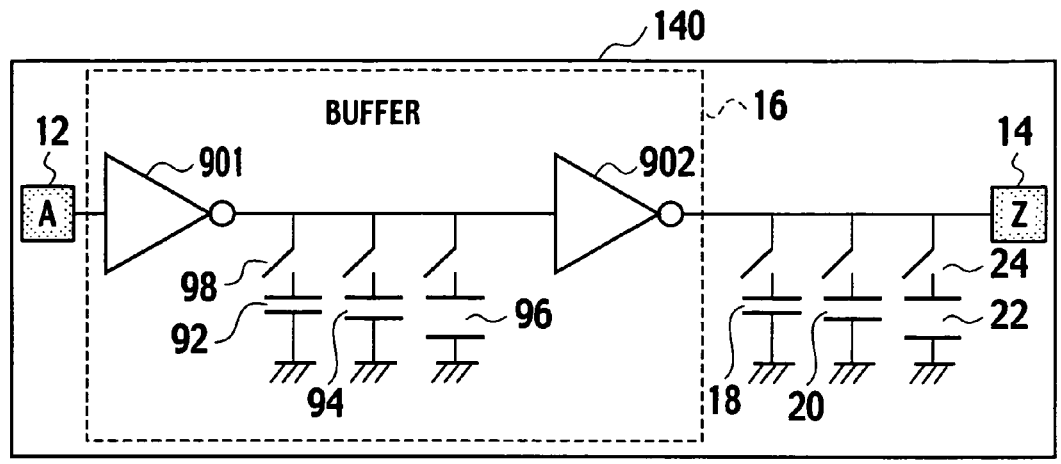
FIG. 22 is a schematic circuit diagram of a variable capacitance embedded buffer configured of two stages of inverter, which is a semiconductor circuit according to a seventh embodiment of the present invention; wherein variable capacitance is applied between the inverters.

A schematic circuit of a variable capacitance embedded buffer 140 configured by two stages of inverter shown in FIG. 22, which is a semiconductor circuit according to a seventh embodiment of the present invention, includes: a buffer 16; an input pad (A) 12 connected to the input terminal of the buffer 16; an output pad (Z) 14 connected to the output terminal of the buffer 16; multiple capacitances 18, 20, and 22 positioned on the output side of the buffer 16, and respectively differ in value, and are mutually connected in parallel; and switches 24 connected between the output pad (Z) 14 and each of the multiple capacitances 18, 20, and 22, and which control the connection therebetween. The buffer 16 includes a first inverter 901 and a second inverter 902; multiple capacitances 92, 94, and 96, which are arranged between the first inverter 901 and the second inverter 902, respectively, and differ in value, and mutually connected in parallel; and switches 98 connected between the output terminal of the first inverter 90 and each of the multiple capacitances 92, 94, and 96, and which control the connection therebetween.

The example of FIG. 22 has three capacitances 18, 20, and 22; however, it is naturally not limited to three capacitances. Furthermore, the number of capacitances 92, 94, and 96 arranged between inverters is three; however, it is naturally not limited to three capacitances. Note that the capacitances 18, 20, and 22 may naturally be omitted from the circuit of FIG. 22. When the capacitances 18, 20, and 22 are omitted, the performance of the semiconductor circuit variable capacitance according to the seventh embodiment of the present invention is adjusted according to the capacitances 92, 94, and 96 connected between the inverters 90.

With the semiconductor circuit according to the seventh embodiment of the present invention, the buffer 16 is configured by two stages of inverter; however, the driving force of the buffer 16 is also adjustable by forming variable capacitances between inverters.

An example of a place-and-route tool for the variable capacitance embedded buffer 140 configured by two stages of inverter corresponding to FIG. 22B, can be very simply shown in FIG. 12.

According to the semiconductor circuit of the seventh embodiment of the present invention, use of a variable capacitance embedded buffer configured by two stages of inverter as a primitive cell with a built-in means for adjusting delay time allows a timing adjustment after detailed routing without rearrangement and rerouting, an adjustment of delay variance due to process variation, and a delay adjustment even after chip formation.

Eighth Embodiment (Control Terminal-Equipped/Variable Capacitance Embedded Buffer Configured by Two Stages of Inverter)

Figure 23A:
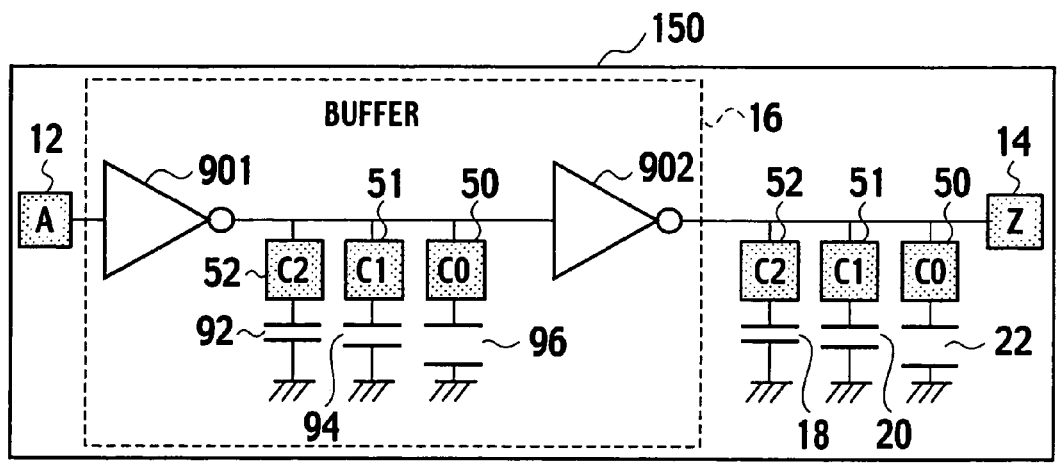
FIG. 23A is a schematic circuit diagram of a control terminal-equipped/variable capacitance embedded buffer configured of two stages of inverter, which is a semiconductor circuit according to an eighth embodiment of the present invention; wherein variable capacitance is applied between the inverters.

A schematic circuit of a control terminal-equipped/variable capacitance embedded buffer 150 configured with two stages of inverter, as shown in FIG. 23A, which is a semiconductor circuit according to an eighth embodiment of the present invention, includes: a buffer 16; an input pad (A) 12 connected to the input terminal of the buffer 16; an output pad (Z) 14 connected to the output terminal of the buffer 16; multiple capacitances 18, 20, and 22 positioned on the output side of the buffer 16, respectively, and differing in value, and are mutually connected in parallel; and control terminals (C2) 52, (C1) 51, and (C0) 50 connected between the output pad (Z) 14 and each of the multiple capacitances 18, 20, and 22, and which control the connection therebetween. The buffer 16 includes a first inverter 901 and a second inverter 902; multiple capacitances 92, 94, and 96 arranged between the first inverter 901 and the second inverter 902, respectively, and differing in value and mutually connected in parallel; and control terminals (C2) 52, (C1) 51, and (C0) 50 connected between the output terminal of the first inverter 901 and each of the multiple capacitances 92, 94, and 96 and which control each connection therebetween.

The example of FIG. 23A has three capacitances 18, 20, and 22; however, it is naturally not limited to three capacitances. Furthermore, the number of capacitances 92, 94, and 96 arranged between the inverters is three; however, it is naturally not limited to three capacitances. Note that the capacitances 18, 20, and 22 may naturally be omitted from the circuit of FIG. 23. When the capacitances 18, 20, and 22 are omitted, the variable capacitance capability of the semiconductor circuit according to the eighth embodiment of the present invention is adjusted according to the capacitances 92, 94, and 96 connected between the inverters 90.

Figure 23B:
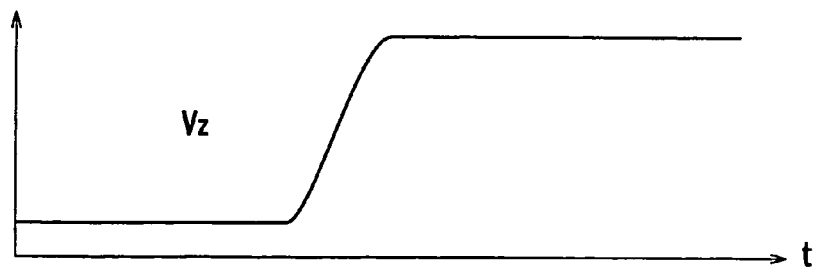
FIG. 23B is a schematic waveform chart explaining that the leading edge of a voltage waveform Vz at an output terminal Z can be adjusted.

With the semiconductor circuit according to the eighth embodiment of the present invention, the buffer 16 is configured by two stages of inverter; however, the driving force of the buffer 16 is also adjustable by applying variable capacitances between the inverters. Furthermore, as shown in FIG. 23B, there is an advantage in that controlling the embedded capacitances 92, 94, and 96 equipped with the control terminals (C2) 52, (C1) 51, (C0) 50 allows a precise adjustment of the leading edge of a voltage waveform Vz at the output pad (Z) 14.

An example of a place-and-route tool for the control terminal-equipped/variable capacitance embedded buffer 150 configured with two stages of inverter corresponding to FIG. 23A, can be very simply shown in FIG. 12.

With the semiconductor circuit according to the eighth embodiment of the present invention, there is a demerit due to an increasing number of control terminals; however, there is a merit in providing a fine adjustment for the falling edge of the voltage waveform.

(Delay Time Control System Circuit)

A circuitry for a delay time control system, as in FIG. 13, which is an application example of the semiconductor circuit according to the eighth embodiment of the present invention, includes: multiple control terminal-equipped/variable capacitance embedded buffers 150; an externally writable memory 62, and multiple control lines 64 connected between the externally writable memory 62 and each of the control terminals (C2) 52, (C1) 51, and (C0) 50 positioned between the inverters 901 and 902 within the multiple control terminal-equipped/variable capacitance embedded buffers 150. Delay time of each of the multiple control terminal-equipped/variable capacitance embedded buffers 150 can be adjusted.

As in FIG. 13, by forming the control terminals (C2) 52, (C1) 51, (C0) 50 between the inverters 901 and 902 within the multiple control terminal-equipped/variable capacitance embedded buffers 150, which are controllable from an externally writable memory 62, such as a non-volatile memory, a delay time adjustment is possible even after chip formation and even after the chip is mounted on a board and incorporated into an application system.

According to the semiconductor circuit of the eighth embodiment of the present invention, use of a control terminal-equipped/variable capacitance embedded buffer configured with two stages of inverter as a primitive cell with a built-in means for adjusting delay time allows a timing adjustment after detailed routing without rearrangement and rerouting, an adjustment of delay variance due to process variation, and a delay adjustment even after chip formation.

Ninth Embodiment (Variable Driving Force Buffer Configured with Two Stages of Inverter)

Figure 24:
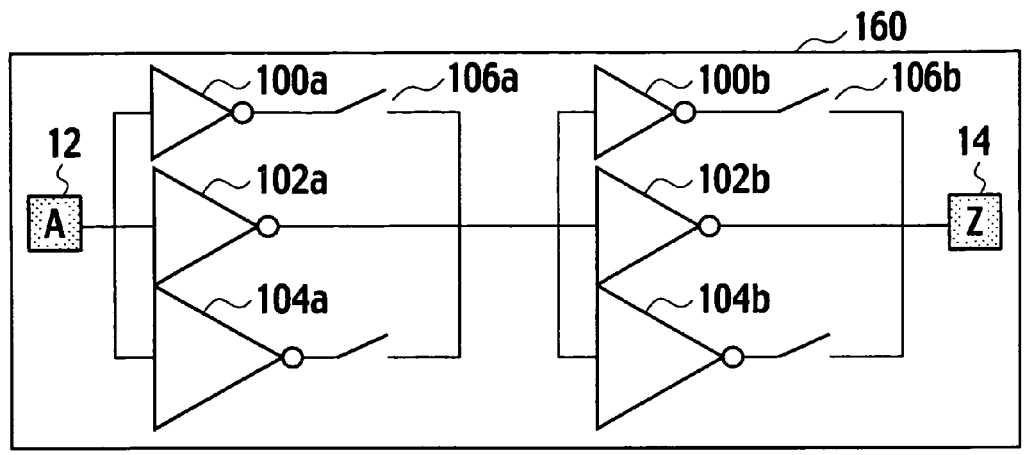
FIG. 24 is a schematic circuit diagram of a variable driving force buffer configured of two stages of inverter, which is a semiconductor circuit according to a ninth embodiment of the present invention; wherein a variable driving force is given to each inverter.

A configuration of a variable driving force buffer 160 configured with two stages of inverter, each with a variable driving force, as shown in FIG. 24, which is a semiconductor circuit according to a ninth embodiment of the present invention, includes: multiple first stage inverters 10a, 102a, and 104a, which respectively differ in driving force, and can be mutually connected in parallel; multiple second stage inverters 100b, 102b, and 104b, which respectively differ in driving force and can be mutually connected in parallel; an input pad (A) 12 connected to the input terminals of the multiple first stage inverters 10a, 102a, and 104a; an output pad (Z) 14 connected to the output terminals of the multiple second stage inverters 100b, 102b, and 104b; switch 106, which control the connection between a group of multiple first stage inverters 100a, 102a, and 104a and a group of multiple second stage inverters 100b, 102b, and 104b; and a switch 106, which controls the connection between the group of the multiple second stage inverters 100b, 102b, and 104b and the output pad (Z) 14.

An exemplary configuration, where only the switch 106a for the first stage inverter 102a and the switch 106b for the second stage inverter 102b are connected, is given in the example of FIG. 24; however, it is apparent that the present invention is not limited thereto. Seven different types of connections of the first stage inverters 100a, 102a, and 104a and the second stage inverters 100b, 102b, and 104b mutually connectable in parallel are possible as an example, as shown in FIG. 16.

By serially connecting two parallel circuits, each made up of three first stage inverters 10a, 102a, and 104a mutually connected in parallel and three second stage inverters 100b, 102b, and 104b mutually connected in parallel, a buffer is configured of two stages of inverter. Structuring each of six inverters with a variable driving force allows configuration of the variable driving force buffer 160, made up of one inverter from the first stage inverters 100a, 102a, 104a and another inverter from the second stage inverters 100b, 102b, 104b.

Each of the first stage inverters 100a, 102a, 104a has a switch 106a, respectively, therefore seven different variable driving forces may be provided by turning each of the switches 106a on or off, as with the circuitry shown in FIG. 16. Accordingly, serially connecting two stages of parallel circuits, which are made up of three first stage inverters 100a, 102a, 104a and three second stage inverters 100b, 102b, 104b mutually connected in parallel, provides 7×7=49 different connection patterns of the inverters and an adjustment of the driving forces. The example of FIG. 24 has three inverters for the first stage inverters 100a, 102a, and 104a; however, it is naturally not limited to three inverters.

Suitable driving forces such as of the inverters 100, 102, and 104 may be given by adjustment of transistor channel widths, as shown in FIGS. 19 and 20, for example.

An example of a place-and-route tool for the variable driving force buffer 160 configured of two stages of inverter corresponding to FIG. 24, can be very simply shown in FIG. 2.

According to the semiconductor circuit of the ninth embodiment of the present invention, use of a variable driving force buffer configured of two stages of inverter as a primitive cell with a built-in means for adjusting delay time allows a timing adjustment after detailed routing without rearrangement and rerouting, an adjustment of delay variance due to process variation, and a delay adjustment even after chip formation.

Tenth Embodiment (Variable Capacitance Embedded NAND Gate)

With the first through ninth embodiments, an exemplary primitive cell configuring a VDC using a buffer has been described. However, not only a buffer applied as the primitive cell configuring a VDC but a primitive cell made up of other transistor gates or the like may also be applied.

Figure 25:
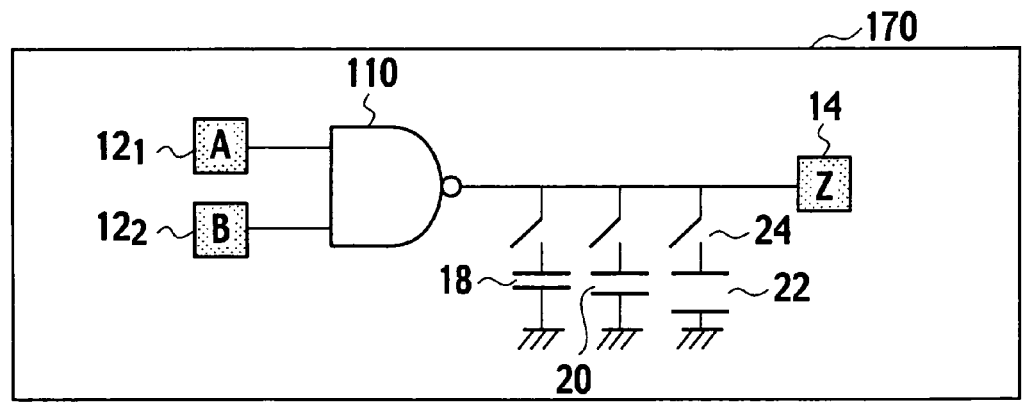
FIG. 25 is a schematic circuit diagram of a variable capacitance embedded NAND gate where variable capacitance is applied to primitive cells, each configured of a NAND gate, which is a semiconductor circuit according to a tenth embodiment of the present invention.

A schematic circuitry of a variable capacitance embedded buffer 170 shown in FIG. 25, which is a semiconductor circuit according to a tenth embodiment of the present invention, includes: a NAND gate 110; input pads (A) 12$_1$ and (B) 12$_2$ connected to the input terminal of the NAND gate 110; an output pad (Z) 14 connected to the output terminal of the NAND gate 110; multiple capacitances 18, 20, and 22 positioned on the output side of the buffer 110, which differ in value, and can be mutually connected in parallel; and switches 24 connected between the output pad (Z) 14 and each of the multiple capacitances 18, 20, and 22, and which control each connection therebetween. The example of FIG. 25 has three capacitances 18, 20, and 22; however, it is naturally not limited to three capacitances.

An example of a place-and-route tool for the variable capacitance embedded NAND gate 170 corresponding to FIG. 25, can be very simply shown in FIG. 2 or the like.

The variable capacitance embedded buffer 170 configured by two stages of inverter corresponding to FIG. 25, can naturally be applied in the same configuration as the variable capacitance embedded buffer 140 configured by two stages of inverter as shown in FIG. 22. In other words, the NAND gate 110 may be used instead of the inverter 901 in FIG. 22.

Alternatively, the same configuration as the variable driving force buffer 160 configured by two stages of inverter may be applied, as shown in FIG. 24. In other words, the NAND gates 110 with adjusted driving forces may be used instead of the first stage inverters 100a, 102a, and 104a in FIG. 24.

Variable driving forces may be implemented by adjustment of transistor channel widths, as shown in FIGS. 19 and 20, for example.

According to the semiconductor circuit of the tenth embodiment of the present invention, use of a variable capacitance embedded NAND gate as a primitive cell, with a built-in means for adjusting delay time, allows a timing adjustment after detailed routing without rearrangement and rerouting, an adjustment of delay variance due to process variation, and a delay adjustment even after chip formation.

Eleventh Embodiment (Control Terminal-Equipped/Variable Capacitance Embedded NAND Gate)

Figure 26:
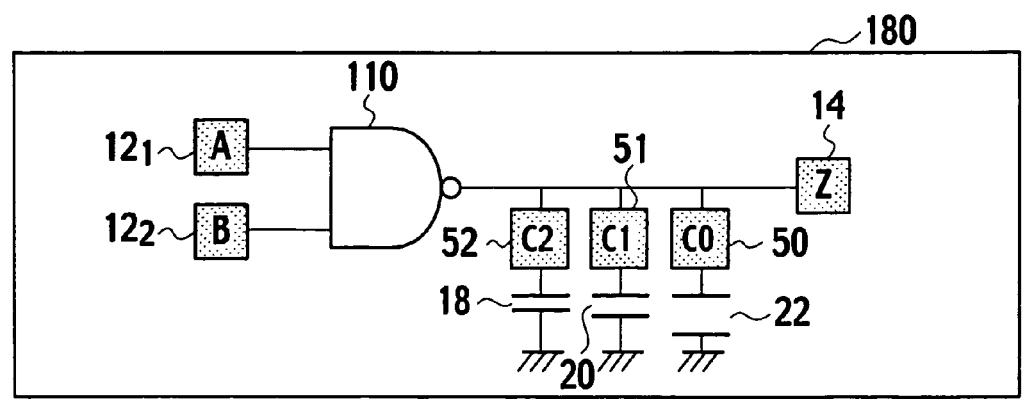
FIG. 26 is a schematic circuit diagram of a control terminal-equipped/variable capacitance embedded NAND gate where variable capacitance is applied to primitive cells, each configured of a NAND gate, which is a semiconductor circuit according to an eleventh embodiment of the present invention.

A schematic circuit of a control terminal-equipped/variable capacitance embedded NAND gate 180 shown in FIG. 26, which is a semiconductor circuit according to an eleventh embodiment of the present invention. The circuit includes: a NAND gate 110; input pads (A) 12, and (B) 122 connected to the input terminal of the NAND gate 110; an output pad (Z) 14 connected to the output terminal of the NAND gate 110; multiple capacitances 18, 20, and 22 positioned on the output side of the NAND gate 110, respectively differing in value, and mutually connected in parallel; and control terminals (C2) 52, (C1) 51, and (C0) 50 connected between the output pad (Z) 14 and each of the multiple capacitances 18, 20, and 22, which control each connection therebetween. The example of FIG. 26 has three capacitances 18, 20, and 22; however, it is naturally not limited to three capacitances.

An example of a place-and-route tool for the control terminal-equipped/variable capacitance embedded NAND gate 180 corresponding to FIG. 26, can be very simply shown in FIG. 12.

The control terminal-equipped/variable capacitance embedded NAND gate 180 corresponding to FIG. 26, according to the eleventh embodiment of the present invention, can naturally be applied in the same configuration as the control terminal-equipped/variable capacitance embedded NAND gate 150 made up of two stages of inverter as shown in FIG. 23A. In other words, the NAND gate 110 may be used instead of the inverter 90 in FIG. 23A.

Alternatively, the same configuration as the variable driving force buffer 160 configured by two stages of inverter may be applied, as shown in FIG. 24. In other words, NAND gates 110 with adjusted driving forces may be used instead of the inverters 100, 102, and 104 in FIG. 24. Variable driving forces may be suitably provided through adjustment of transistor channel widths, as shown in FIGS. 19 and 20, for example.

(Delay Time Control System Circuit)

A delay time control system circuit, which is an application example of the semiconductor circuit according to the eleventh embodiment of the present invention, may be configured by arranging a plurality of the control terminal-equipped/variable capacitance embedded buffer 180 and controlling the delay time of the semiconductor circuit from an externally writable memory 62, as shown in FIG. 13. As with the circuit in FIG. 13, connecting control lines 64 to the control terminals (C2) 52, (C1) 51, (C0) 50 in the control terminal-equipped/variable capacitance embedded NAND gate 180 from the externally writable memory 62 allows an external adjustment of delay time of the control terminal-equipped/variable capacitance embedded NAND gate 180.

As with the circuit in FIG. 13, by forming the control terminals (C2) 52, (C1) 51, (C0) 50 in the control terminal-equipped/variable capacitance embedded NAND gate 180, which are controllable from the externally writable memory 62 such as a nonvolatile memory, a delay time adjustment is possible even after chip formation and even after the chip is mounted on a board and incorporated into an application system.

According to the semiconductor circuit of the eleventh embodiment of the present invention, use of a control terminal-equipped/variable capacitance embedded NAND gate as a primitive cell, with a built-in means for adjusting delay time, allows a timing adjustment after detailed routing without rearrangement and rerouting, an adjustment of delay variance due to process variation, and a delay adjustment even after chip formation.

Twelfth Embodiment (Variable Capacitance and/or Variable Driving Force Buffer AND Gate)

With the first through ninth embodiments, an exemplary primitive cell configuring a VDC using a buffer, has been described. In the tenth and the eleventh embodiment, an exemplary primitive cell configuring a VDC using a NAND gate was described.

Figure 27A:
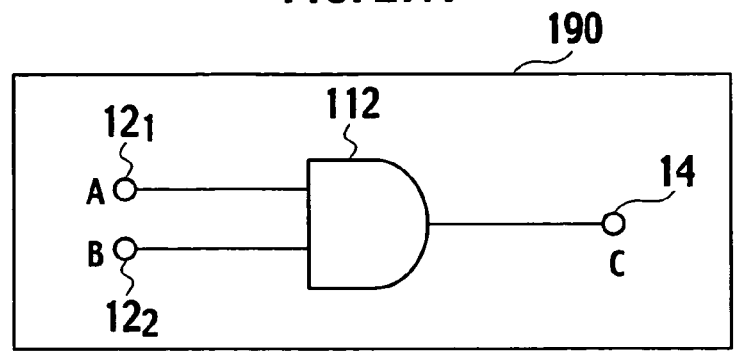
FIG. 27A is an exemplary configuration of a primitive cell configured of a variable capacitance and/or adjustable driving force embedded AND gate, which is a semiconductor circuit according to a twelfth embodiment of the present invention.
Figure 27B:
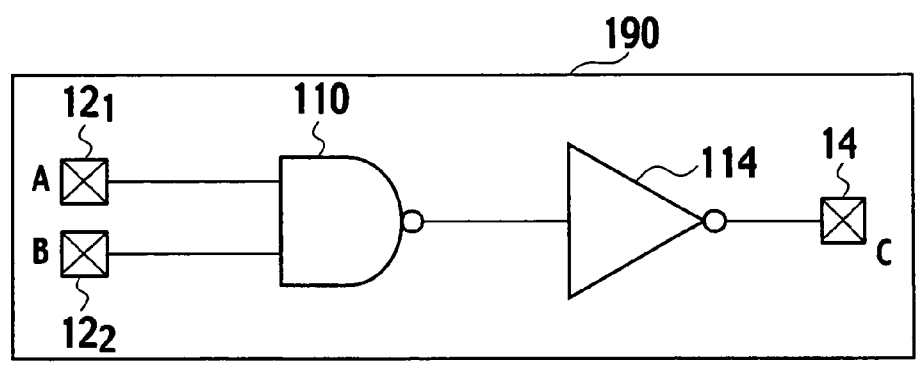
FIG. 27B is an exemplary configuration of a primitive cell configured of a NAND gate and an inverter, which is the semiconductor circuit according to the twelfth embodiment of the present invention.
Figure 27C:
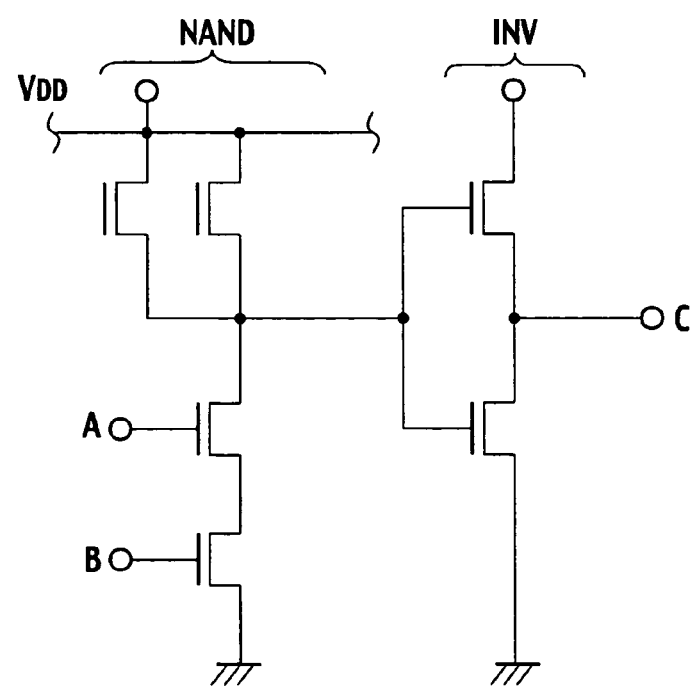
FIG. 27C is a schematic circuit diagram of the primitive cell configured of a NAND gate and an inverter, which is the semiconductor circuit according to the twelfth embodiment of the present invention.

As a semiconductor circuit according to a twelfth embodiment of the present invention, an exemplary primitive cell configuring a VDC using an AND gate is shown in FIG. 27A. An exemplary configuration of a primitive cell made up of a NAND gate and an inverter is shown in FIG. 27B. A schematic circuit of a primitive cell of a NAND gate and an inverter is shown in FIG. 27C. The configuration of FIG. 27B is an example for embodying the circuit in FIG. 27A, and the circuit of FIG. 27C is an example for embodying a combination of a NAND gate 110 and an inverter 114 shown in FIG. 27B.

A variable capacitance and/or variable driving force buffer AND gate 190, according to a twelfth embodiment of the present invention, includes an AND gate 112, input pads (A) 12$_1$ and (B) 12$_2$ connected to the input terminal of the AND gate 190; and an output pad (C) connected to the output terminal of the AND gate 112. Description of the configuration providing variable capacitance and/or variable driving force is omitted in the example of FIG. 27A. It is apparent from FIG. 25 or FIG. 26 that use of an AND gate 112 instead of the NAND gate 110 implements a variable capacitance embedded AND gate or a control terminal-equipped/variable capacitance embedded AND gate.

An example of a place-and-route tool for the variable capacitance and/or variable driving force embedded AND gate 190 corresponding to FIG. 27, can be very simply shown in FIG. 2.

Furthermore, as shown in FIG. 14, use of the AND gate 112 with an adjusted variable driving force shown in FIG. 27 instead of the buffers 72, 74, and 76 mutually connectable in parallel, allows implementation of a variable driving force embedded AND gate.

Alternatively, the same configuration as the variable capacitance embedded buffer configured by two stages of inverter may naturally be applied, as shown in FIG. 22. In other words, the AND gate 112 may be used instead of the inverter 901, 902 in FIG. 22.

Alternatively, the same configuration as the variable capacitance embedded buffer 160 configured with two stages of inverter may be applied, as shown in FIG. 24. In other words, AND gates 112 with adjusted driving forces may be used instead of the inverters 100, 102, and 104 in FIG. 24.

Variable driving forces may be provided through an adjustment of transistor channel widths, as shown in FIGS. 19 and 20, for example.

According to the semiconductor circuit of the twelfth embodiment of the present invention, use of a variable capacitance and/or variable driving force embedded AND gate as a primitive cell, with a built-in means for adjusting delay time, allows a timing adjustment after detailed routing without rearrangement and rerouting, an adjustment of delay variance due to process variation, and a delay adjustment even after chip formation.

Other Embodiments

As described above, the present invention is described according to the first through twelfth embodiments. However, it should not be perceived that descriptions and drawings forming a part of this disclosure are intended to limit the spirit and scope of the present invention. Various alternative embodiments, working examples, and operational techniques will become apparent from this disclosure for those skills in the art.

In addition to a variable capacitance and/or variable driving force buffer, a variable capacitance and/or variable driving force embedded NAND gate, or a variable capacitance and/or variable driving force embedded AND gate as a primitive cell configuring a VDC, a primitive cell made up of another transistor gate or the like may be applied.

In this manner, the present invention naturally includes various embodiments not described herein. Accordingly, the technical range of the present invention is determined only by the following claims that can be regarded appropriate from the above-mentioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A semiconductor circuit connected between an input pad and an output pad of a primitive cell for an automatic routing tool, comprising:
   a first buffer connected between the input pad and the output pad; and
   a plurality of capacitances connectable in parallel between a fixed potential and a current flow path positioned between an output terminal of the first buffer and the output pad,
   a second buffer positioned between the input pad and the output pad and connected in parallel to the first buffer and which provides a driving force different from that of the first buffer;
   wherein
   a connection between each of the plurality of capacitances and the output pad is controlled, and
   a connection between the output terminal of the first buffer and the output pad and a connection between the output terminal of the second buffer and the output pad are respectively controlled.

2. The semiconductor circuit of claim 1, wherein the plurality of capacitances mutually differ in value.

3. The semiconductor circuit of claim 1, further comprising:
   a first switch connected in series between the output pad and the first buffer to control a connection therebetween; and
   a second switch connected in series between the second buffer and the output pad to control a connection therebetween.

4. The semiconductor circuit of claim 1, further comprising:
   a first control terminal connected in series between the output pad and the first buffer to control a connection therebetween; and
   a second control terminal connected in series between the second buffer and the output pad to control a connection therebetween.

5. The semiconductor circuit of claim 1, wherein driving forces of the first and the second buffers are varied by respectively adjusting a channel width by adjusting a length of a gate electrode of each of transistors configuring the first and the second buffers, respectively.

6. The semiconductor circuit of claim 1, further comprising a plurality of switches, each connected in series between a corresponding one of the plurality of capacitances and the output pad, and each individually controlling a connection between the corresponding one of the plurality of capacitances and the output pad.

7. The semiconductor circuit of claim 1, further comprising a plurality of control terminals, each connected in series between a corresponding one of the plurality of capacitances and the output pad, and each individually controlling a connection between the corresponding one of the plurality of capacitances and the output pad.

8. A semiconductor circuit connected between an input pad and an output pad of a primitive cell for an automatic routing tool, comprising:
   a first buffer connected between the input pad and the output pad; and
   a plurality of capacitances connectable in parallel between a fixed potential and a current flow path positioned between an output terminal of the first buffer and the output pad, wherein
   a connection between each of the plurality of capacitances and the output pad is controlled,
   the first buffer includes an AND gate,
   the input pad is connected to an input terminal of the AND gate, and
   the output pad is connected to an output terminal of the AND gate.

9. A semiconductor circuit connected between an input pad and an output pad of a primitive cell for an automatic routing tool, comprising:
   a first buffer connected between the input pad and the output pad; and
   a plurality of capacitances connectable in parallel between a fixed potential and a current flow path positioned between an output terminal of the first buffer and the output pad, wherein the first buffer further comprises:
   a first NAND gate;
   a second NAND gate connected in series to the first NAND gate; and
   a plurality of capacitances mutually connectable in parallel, positioned between an output terminal of the first NAND gate and an input terminal of the second NAND gate, and respectively having different values, a connection between each of the plurality of capacitances and the output pad is controlled, and a connection between each of the plurality of capacitances and the output terminal of the first NAND gate is controlled so as to adjust delay time of the semiconductor circuit.

10. A semiconductor circuit connected between an input pad and an output pad of a primitive cell for an automatic routing tool, comprising:

a first buffer connected between the input pad and the output pad; and a plurality of capacitances connectable in parallel between a fixed potential and a current flow path positioned between an output terminal of the first buffer and the output pad, wherein the first buffer further comprises:

a NAND gate;

an inverter connected in series to the NAND gate; and a plurality of capacitances mutually connectable in parallel, positioned between an output terminal of the NAND gate and an input terminal of the inverter, and respectively having different values, a connection between each of the plurality of capacitances and the output pad is controlled, and a connection between each of the plurality of capacitances and the output terminal of the NAND gate is controlled so as to adjust delay time of the semiconductor circuit.

11. A delay time control system circuit, comprising:

a plurality of buffers, each of the buffers connected between an input pad and an output pad of a primitive cell for an automatic routing tool and comprising:

a first buffer connected between the input pad and the output pad, a plurality of capacitances connectable in parallel between a fixed potential and a current flow path positioned between an output terminal of the first buffer and the output pad, and a plurality of control terminals, each connected in series between a corresponding one of the plurality of capacitances and the current path, and each individually controlling a connection between the corresponding one of the plurality of capacitances and the current path;

an externally writable memory; and a plurality of control lines connected between the externally writable memory and each of the plurality of control terminals of the plurality of buffers, wherein the connection of each of the plurality of capacitances between the current flow path and the fixed potential is controlled through the plurality of control lines so as to externally adjust delay time of the plurality of buffers.

* * * * *